(12) United States Patent
Wang et al.

(10) Patent No.: US 9,935,104 B1
(45) Date of Patent: Apr. 3, 2018

(54) FIN-TYPE FIELD EFFECT TRANSISTORS WITH SINGLE-DIFFUSION BREAKS AND METHOD

(71) Applicant: GLOBALFOUNDRIES INC., Grand Cayman (KY)

(72) Inventors: Haiting Wang, Clifton Park, NY (US); Wei Zhao, Fort Lee, NJ (US); Hong Yu, Rexford, NY (US); Xusheng Wu, Ballston Lake, NY (US); Hui Zang, Guilderland, NY (US); Zhenyu Hu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/589,292

(22) Filed: May 8, 2017

(51) Int. Cl.
| | |
|---|---|
| *H01L 21/84* | (2006.01) |
| *H01L 27/088* | (2006.01) |
| *H01L 21/8234* | (2006.01) |
| *H01L 21/311* | (2006.01) |
| *H01L 29/06* | (2006.01) |
| *H01L 21/308* | (2006.01) |
| *H01L 21/02* | (2006.01) |

(52) U.S. Cl.
CPC .... *H01L 27/0886* (2013.01); *H01L 21/02164* (2013.01); *H01L 21/3086* (2013.01); *H01L 21/31111* (2013.01); *H01L 21/823418* (2013.01); *H01L 21/823431* (2013.01); *H01L 21/823468* (2013.01); *H01L 21/823481* (2013.01); *H01L 29/0649* (2013.01)

(58) Field of Classification Search
CPC ........... H01L 27/0886; H01L 21/02164; H01L 21/3086; H01L 21/31111; H01L 21/823418; H01L 21/823431; H01L 21/823468; H01L 21/823481; H01L 29/0649; H01L 21/845; H01L 27/10879; H01L 29/41791; H01L 27/0924; H01L 27/10826; H01L 29/66772
USPC ......... 257/288, 368, 369; 438/151, 197, 199
See application file for complete search history.

(56) References Cited

U.S. PATENT DOCUMENTS

| | | | |
|---|---|---|---|
| 8,609,510 B1 * | 12/2013 | Banna | ............... H01L 29/66545 257/E21.409 |
| 8,846,491 B1 | 9/2014 | Pham et al. | |
| 8,916,460 B1 | 12/2014 | Kwon et al. | |

(Continued)

*Primary Examiner* — Jarrett Stark
*Assistant Examiner* — Shahed Ahmed
(74) *Attorney, Agent, or Firm* — Gibb & Riley, LLC; Francois Pagette

(57) ABSTRACT

Disclosed is a semiconductor structure, including at least one fin-type field effect transistor and at least one single-diffusion break (SDB) type isolation region, and a method of forming the semiconductor structure. In the method, an isolation bump is formed above an isolation region within a semiconductor fin and sidewall spacers are formed on the bump. During an etch process to reduce the height of the bump and to remove isolation material from the sidewalls of the fin, the sidewall spacers prevent lateral etching of the bump. During an etch process to form source/drain recesses in the fin, the sidewalls spacers protect the semiconductor material adjacent to the isolation region. Consequently, the sides and bottom of each recess include semiconductor surfaces and the angle of the top surfaces of the epitaxial source/drain regions formed therein is minimized, thereby minimizing the risk of unlanded source/drain contacts.

14 Claims, 23 Drawing Sheets

(56) References Cited

U.S. PATENT DOCUMENTS

| | | |
|---|---|---|
| 9,171,752 B1 | 10/2015 | Wu et al. |
| 9,368,496 B1 | 6/2016 | Yu et al. |
| 9,412,616 B1 | 8/2016 | Xie et al. |
| 9,524,911 B1 | 12/2016 | Tsai et al. |
| 2016/0049468 A1 | 2/2016 | Wu et al. |
| 2016/0225762 A1 | 8/2016 | Zang et al. |
| 2017/0170266 A1* | 6/2017 | Horak .................. H01L 29/0653 |

* cited by examiner

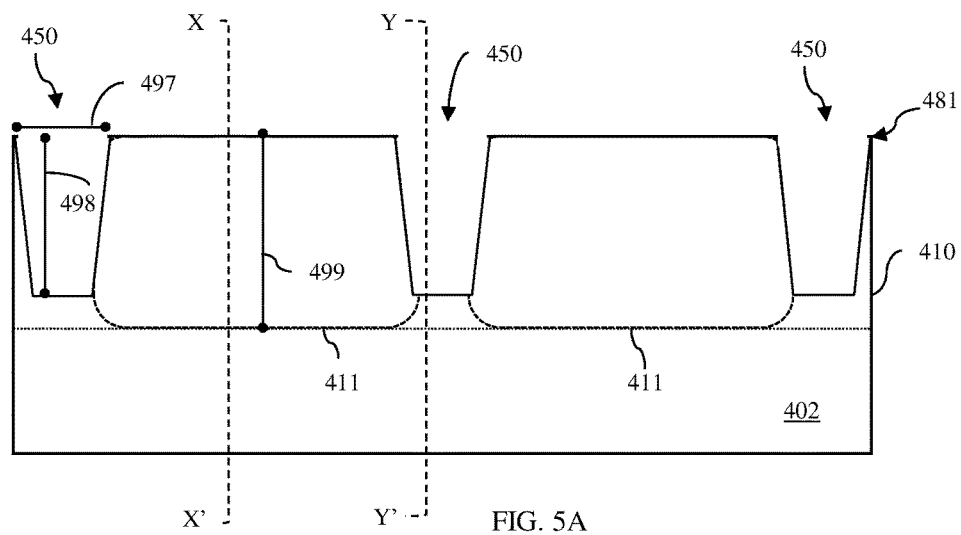
FIG. 5A
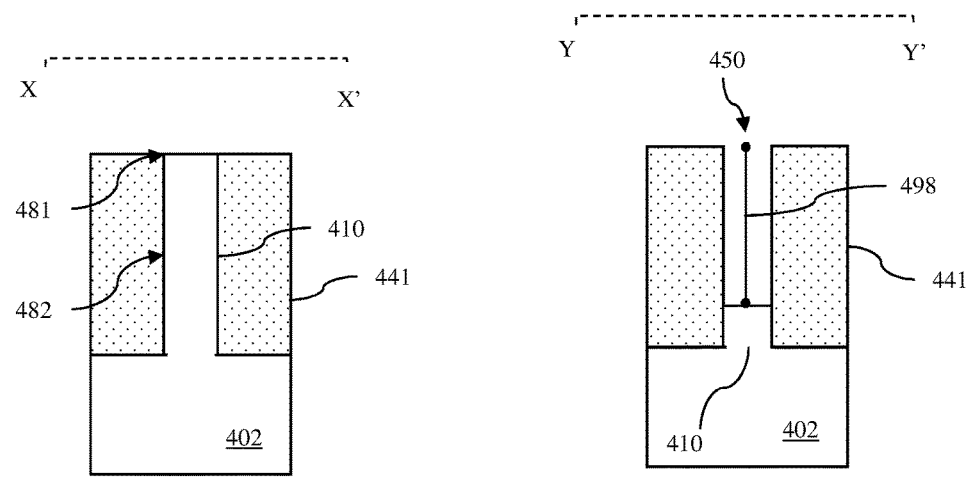
FIG. 5B
FIG. 5C

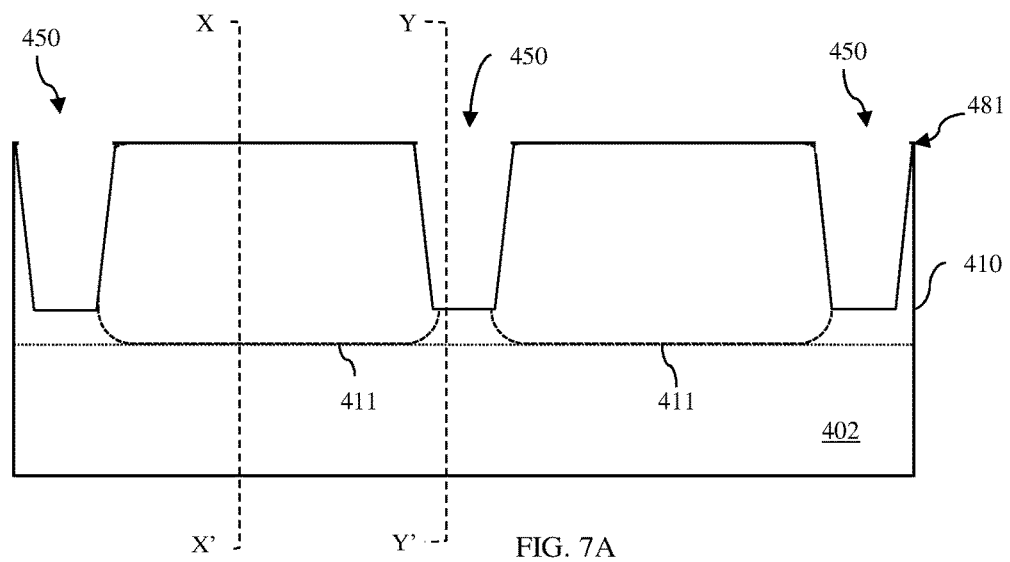
FIG. 7A
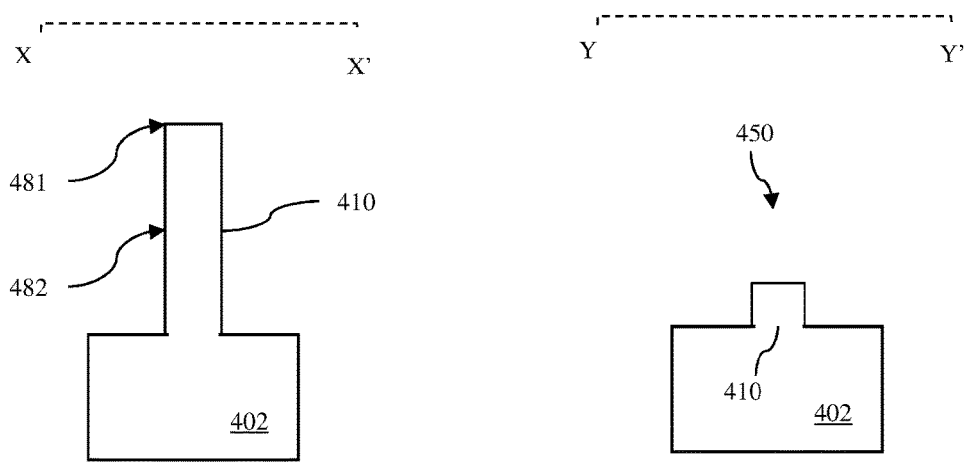
FIG. 7B
FIG. 7C

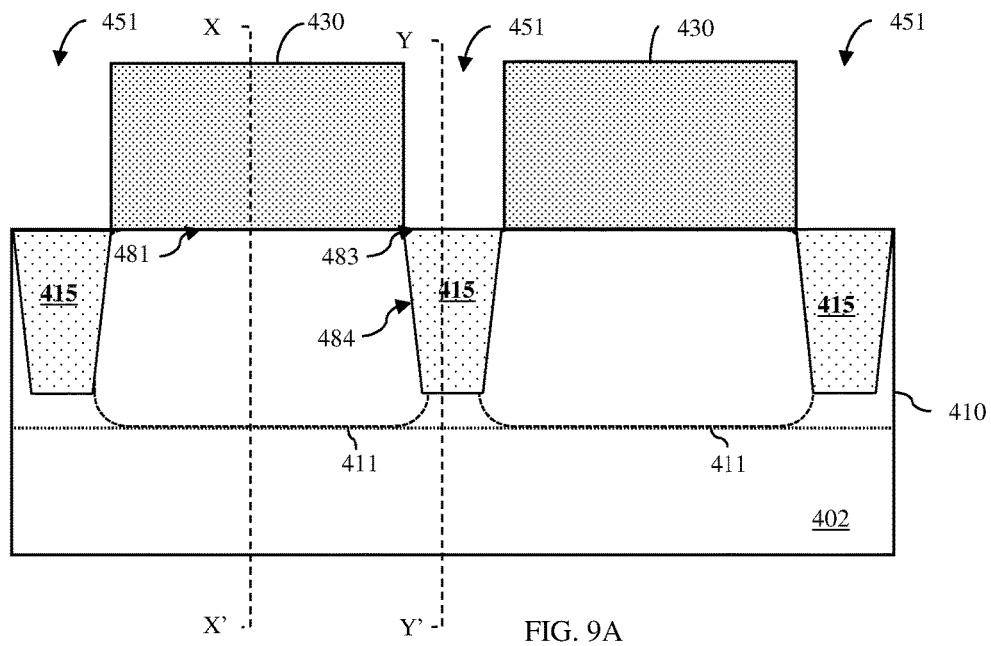
FIG. 9A
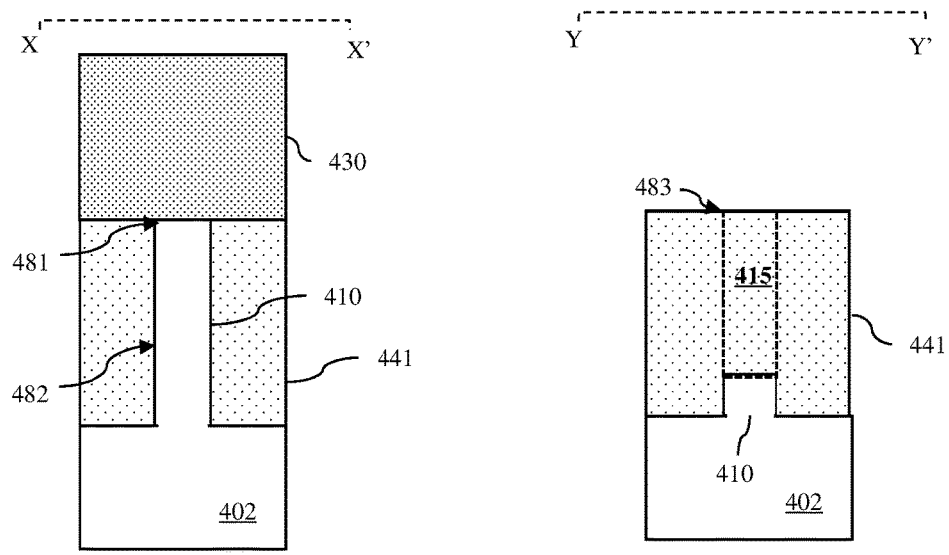
FIG. 9B
FIG. 9C

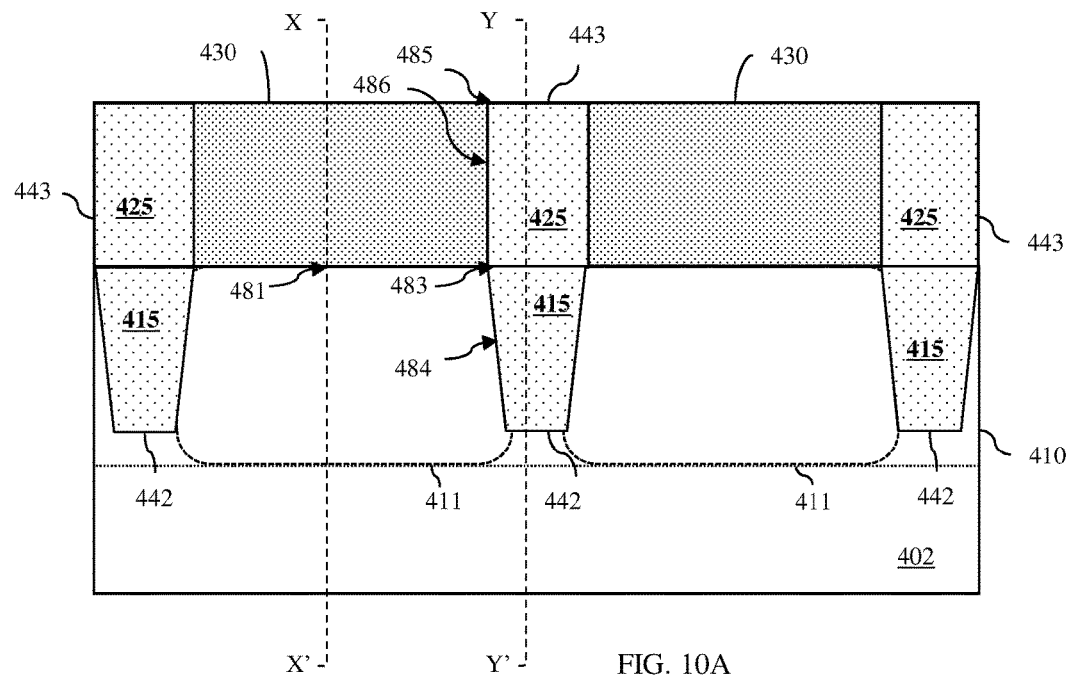
FIG. 10A
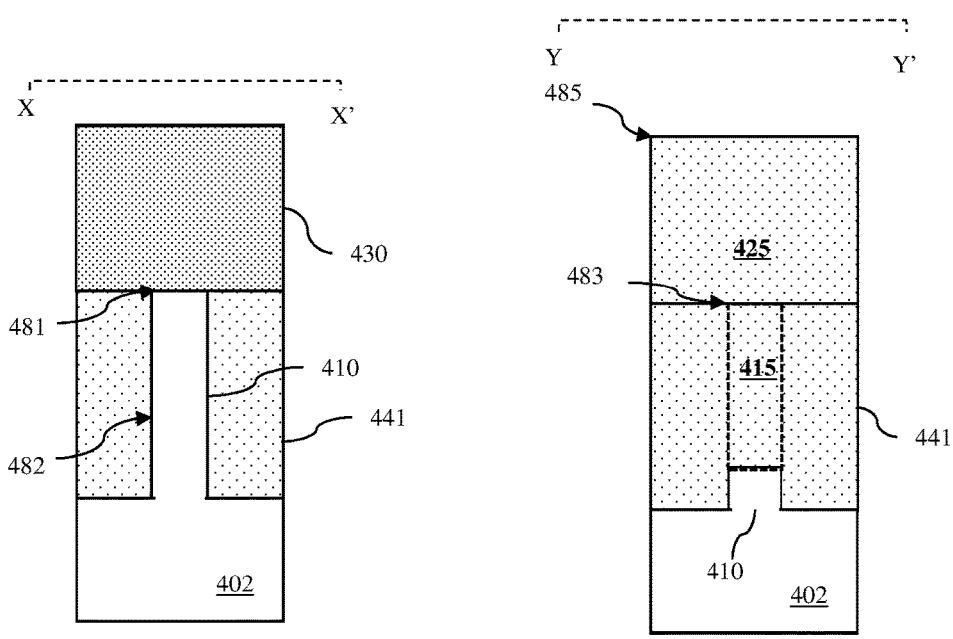
FIG. 10B
FIG. 10C

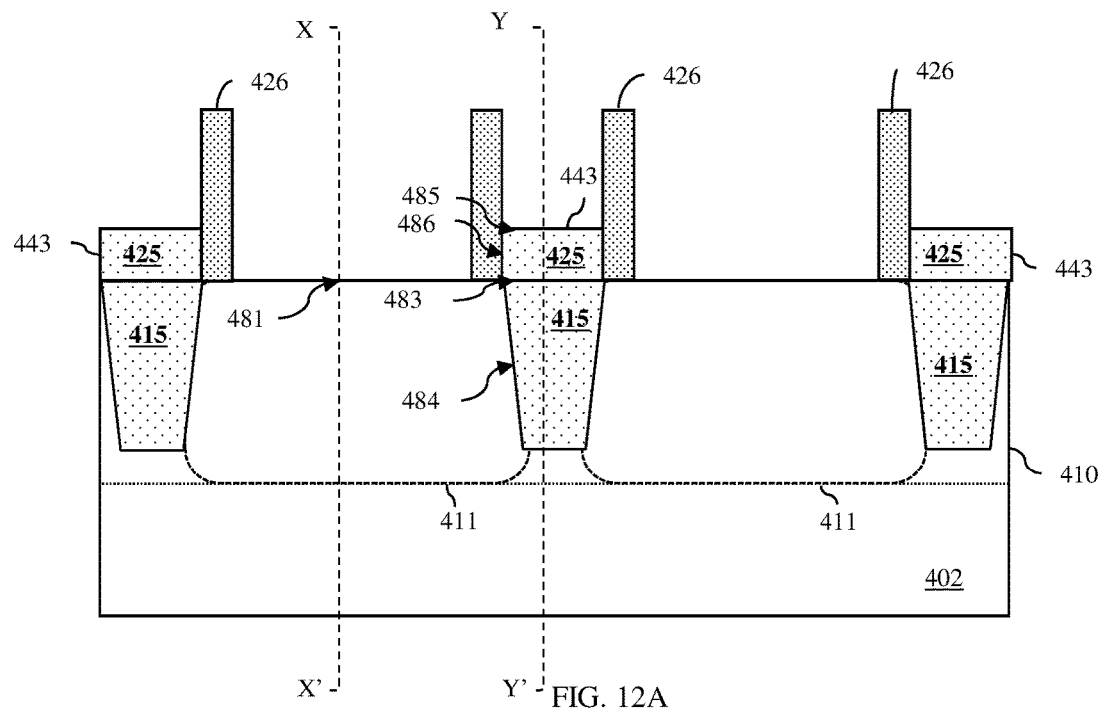
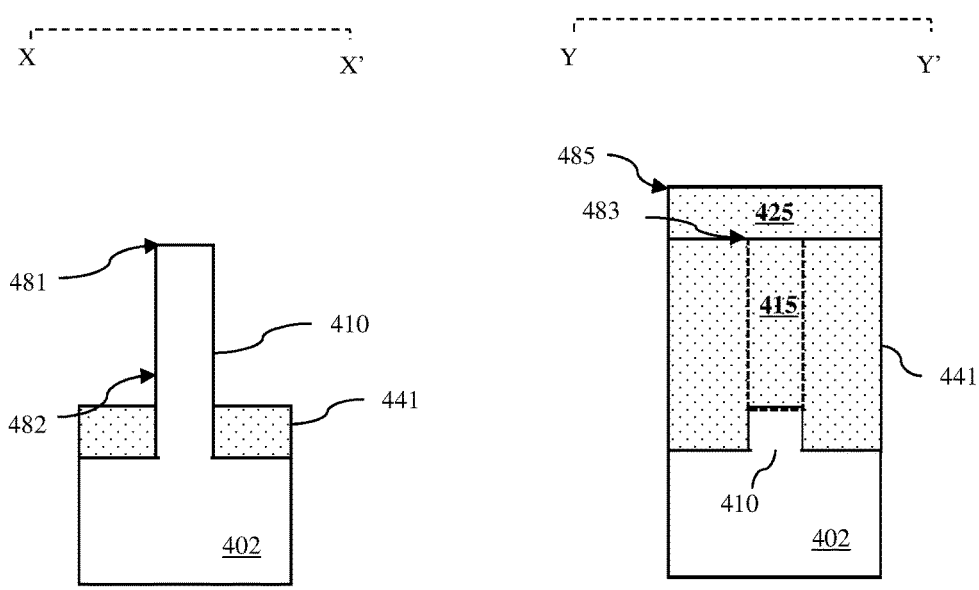
FIG. 12A
FIG. 12B
FIG. 12C

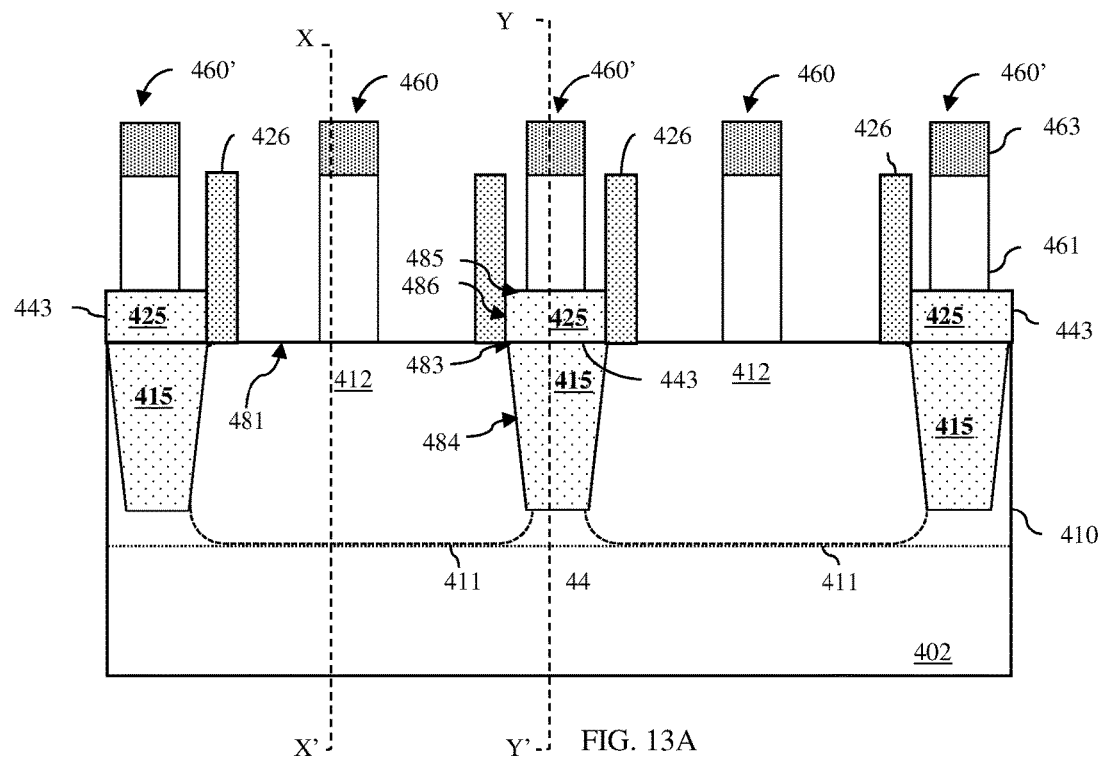
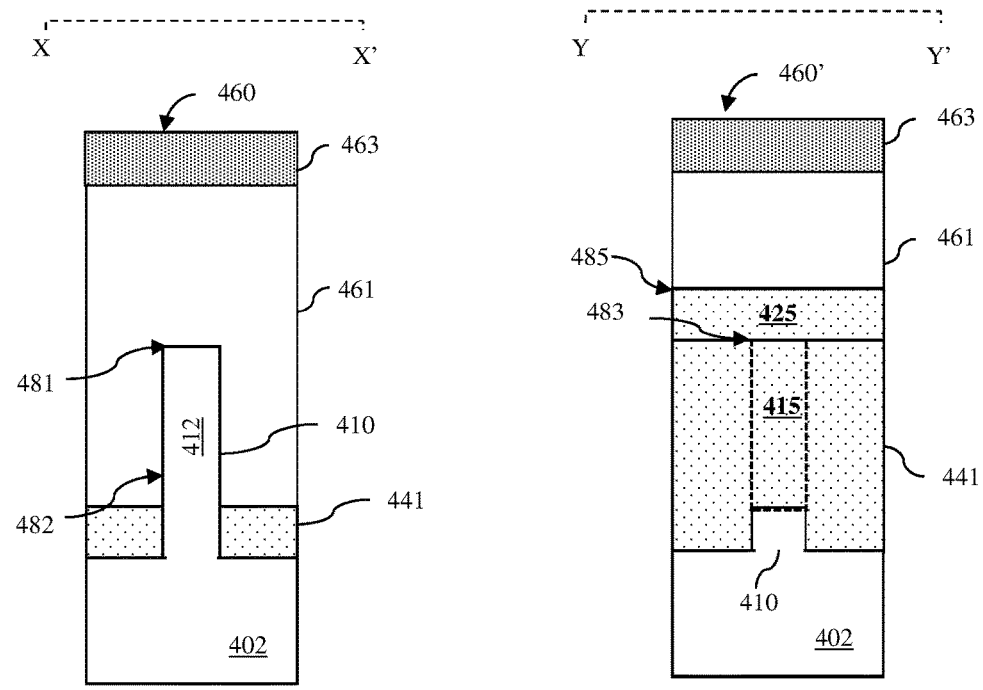
FIG. 13B
FIG. 13C

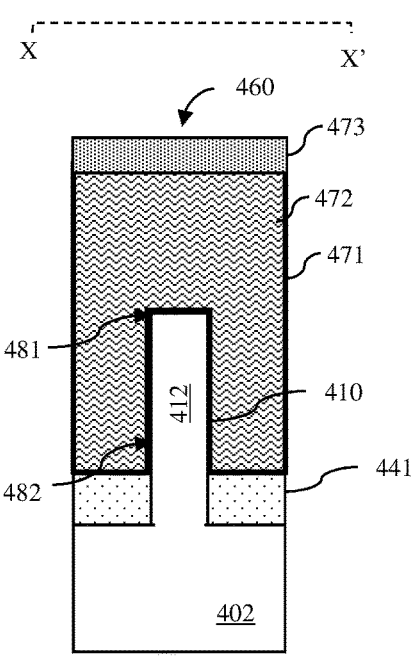
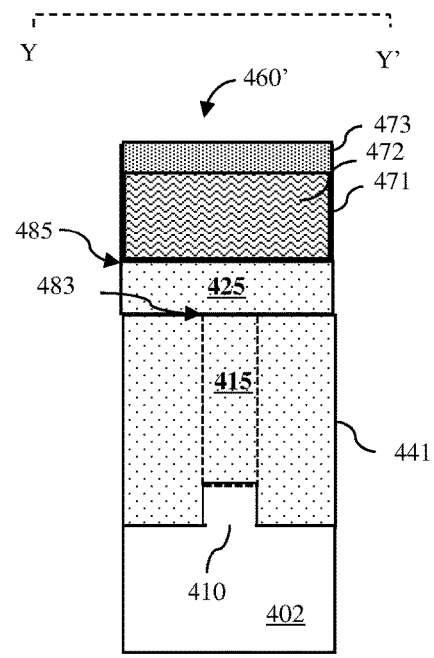
FIG. 21B
FIG. 21C

US 9,935,104 B1

FIN-TYPE FIELD EFFECT TRANSISTORS WITH SINGLE-DIFFUSION BREAKS AND METHOD

BACKGROUND

Field of the Invention

The present invention relates to single-diffusion break (SDB) fin-type field effect transistors (FINFETs) and an improved method of forming such SDB FINFETs.

Description of Related Art

More specifically, integrated circuit design decisions are often driven by device scalability, device density, manufacturing efficiency and costs. For example, size scaling of planar field effect transistors (FETs) resulted in the development of planar FETs with relatively short channel lengths and, unfortunately, the smaller channel lengths resulted in a corresponding increase in short channel effects and a decrease in drive current. In response, non-planar FET technologies (e.g., fin-type FET (FINFET) technologies) were developed. A FINFET is a non-planar FET that incorporates a semiconductor fin (i.e., a relatively tall and thin, elongated, rectangular-shaped, semiconductor body) and, within the semiconductor fin, a channel region positioned laterally between source/drain regions. A gate is positioned adjacent to the top surface and opposing sidewalls of the semiconductor fin at the channel region. Such a FINFET exhibits two-dimensional field effects as compared to the single-dimensional field effects exhibited by a planar FET and, thus, exhibits increased drive current. Unfortunately, as FINFET size continues to decrease and FINFET density continues to increase, it can be difficult to form FINFETs without compromising robustness.

SUMMARY

In view of the foregoing, disclosed herein is a method of forming a semiconductor structure that includes one or more fin-type field effect transistors (FINFETs) and one or more single-diffusion break (SDB) type isolation region(s) that provide isolation for the FINFET(s). In the method, trench isolation region(s) (e.g., SDB type isolation region(s)) can be formed within a semiconductor fin; an isolation bump (e.g., a silicon dioxide bump) can be formed above each trench isolation region; and sidewall spacers can be formed on each isolation bump. During a subsequent etch process to reduce the height of the isolation bump(s) and to remove isolation material from the sidewalls of the semiconductor fin, the sidewall spacers prevent any lateral etching of the isolation bump(s), thereby providing control over the final shape of the isolation bump(s). Furthermore, during a subsequent etch process to form source/drain recesses in the semiconductor fin, the sidewalls spacers protect the semiconductor material adjacent to each trench isolation region. Consequently, each source/drain recess will have opposing sides and a bottom that include semiconductor surfaces and the angle of the top surfaces of epitaxial source/drain regions, which are subsequently formed within the source/drain recesses, relative to the top surface of the semiconductor fin will be minimized. Thus, the risk that subsequently formed source/drain contacts will not reach the source/drain regions will be reduced (i.e., the risk of unlanded source/drain contacts will also be reduced). Also disclosed herein is a semiconductor structure formed according to the method.

More particularly, disclosed herein is a method of forming a semiconductor structure, which includes one or more fin-type field effect transistors (FINFETs) and one or more single-diffusion break (SDB) type isolation region(s) that provide isolation for the FINFET(s).

Generally, in this method, a trench isolation region (e.g., an SDB type isolation region) is formed in a semiconductor fin. The semiconductor fin has a first top surface and first opposing sidewalls and the trench isolation region has a second top surface and second opposing sidewalls. A hard mask layer can be formed on the partially completed structure and, particularly, on the first top surface of the semiconductor fin and the second top surface of the trench isolation region. A bump opening can be formed in the hard mask layer such that it is aligned above the trench isolation region and such that the second top surface of the trench isolation region is exposed at the bottom of the bump opening. An isolation bump can be formed in the bump opening on the trench isolation region. The isolation bump can have a third top surface and third opposing sidewalls, on the trench isolation region.

After the isolation bump is formed, sidewall spacers can be formed on the third opposing sidewalls of the isolation bump. The sidewall spacers can be made of a different material than the isolation bump and can specifically be formed so that they completely cover the third opposing sidewalls of the isolation bump. Furthermore, a combination of the width of the isolation bump and the width of each sidewall spacer should be such that at least outer portions of the sidewall spacers are above and immediately adjacent to the first top surface of the semiconductor fin.

After the sidewall spacers are formed on the isolation bump, an etch process can be performed so as to expose the first opposing sidewalls of the semiconductor fin and to recess the third top surface of the isolation bump. During this etch process, the sidewall spacers prevent lateral etching of the isolation bump in order to control the final shape of the isolation bump.

In one particular embodiment of the method disclosed herein, trench isolation regions (e.g., SDB type isolation regions) are formed in a semiconductor fin. The semiconductor fin has a first top surface and first opposing sidewalls and each trench isolation regions has a second top surface and second opposing sidewalls. A hard mask layer can be formed on the partially completed structure and, particularly, on the first top surface of the semiconductor fin and over the second top surface of each trench isolation region. Bump openings can be formed in the hard mask layer such that each bump opening is aligned above a trench isolation region and such that the second top surface of the trench isolation region is exposed at the bottom of each bump opening. Isolation bumps can then be formed on the trench isolation regions in the bump openings, respectively. Each isolation bump having a third top surface and third opposing sidewalls.

After the isolation bumps are formed, sidewall spacers can be formed on the third opposing sidewalls of each of the isolation bumps. The sidewall spacers can be formed, for example, using the material of the hard mask layer. Specifically, a dry etch process can be performed in order to remove portions of the hard mask layer from horizontal surfaces and to leave intact portions of the hard mask layer on vertical surfaces, thereby forming the sidewall spacers. It should be noted that the hard mask layer can be made of a different material than the isolation bumps and can specifically be formed so that the resulting sidewall spacers completely cover the third opposing sidewalls of the isolation bumps. Furthermore, a combination of the width of each isolation bump and the width of each sidewall spacer thereon should be such that at least outer portions of the sidewall spacers are above and immediately adjacent to the first top surface of the semiconductor fin.

After the sidewall spacers are formed on the isolation bumps, an etch process can be performed to expose the first opposing sidewalls of the semiconductor fin and to recess the third top surface of each of the isolation bumps. During this etch process, the sidewall spacers prevent lateral etching of the isolation bumps in order to control the final shapes of the isolation bumps.

Each of the method embodiments can further include additional process steps that use the active device region(s) of the semiconductor fin to form FINFET(s). Specifically, to form FINFET(s), gate structures can be formed on each isolation bump and on each active device region adjacent to a channel region. Additional sidewall spacers can be formed on the gate structures.

After the gate structures and additional sidewall spacers are formed, source/drain recesses can be formed in each active device region such that a channel region is positioned laterally between a pair of source/drain recesses. During the etch process to form the source/drain recesses, the sidewall spacers on each isolation bump protect the areas of the semiconductor fin adjacent to the second opposing sidewalls of each trench isolation region. Thus, the source/drain recesses will be physically separated from the trench isolation region(s) and, within each source/drain recess, semiconductor surfaces will be exposed at a first side of the source/drain recess adjacent to a channel region, at a second side of the source/drain recess adjacent to a trench isolation region and at a bottom of the source/drain recess. A semiconductor layer can then be epitaxially deposited onto the semiconductor surfaces within each source/drain recess, thereby forming source/drain regions each having a fourth top surface. Since the opposing sides and bottoms of the source/drain recesses include semiconductor surfaces, the angle of the fourth top surface of each source/drain region relative to the first top surface of the semiconductor fin will be minimized and the risk that subsequently formed source/drain contacts will not reach the source/drain regions will also be minimized (i.e., the risk of unlanded source/drain contacts will also be minimized).

Also disclosed herein is a semiconductor structure formed according to the above-described method so as to have one or more fin-type field effect transistors (FINFETs) and one or more single-diffusion break (SDB) type isolation region(s) that provide isolation for the FINFET(s).

Specifically, the semiconductor structure can include a semiconductor fin. The semiconductor fin can have a first top surface and first opposing sidewalls and can include an active device region.

The semiconductor structure can further include at least one trench isolation region (e.g., an SDB type isolation region) in the semiconductor fin positioned laterally adjacent to the active device region. For example, each active device region can be positioned laterally between a pair of adjacent trench isolation regions. Each trench isolation region can have a second top surface and second opposing sidewalls.

The semiconductor structure can further include isolation bump(s) on the second top surface of the trench isolation region(s), respectively. The isolation bump(s) can each have a third top surface and third opposing sidewalls. Sidewall spacers can be on the third opposing sidewalls of each isolation bump. The sidewall spacer(s) can be made of a different material than the isolation bump(s) and at least an outer portion of each sidewall spacer can be above and immediately adjacent to the first top surface of the semiconductor fin.

The semiconductor structure can further include at least one transistor and, particularly, a FINFET. Each FINFET can include a channel region within an active device region and positioned laterally between source/drain regions. The source/drain regions can include source/drain recesses, which are within the semiconductor fin, which are filled with a semiconductor layer, and which have a fourth top surface. At least one of the source/drain regions can be positioned laterally between the channel region and a trench isolation region so as to have a first side adjacent to the channel region and a second side opposite the first side, but physically separated from the trench isolation region.

As mentioned above, during processing, the sidewall spacers on the isolation bump(s) protect the area of the semiconductor fin immediately adjacent the trench isolation region(s) to ensure that semiconductor surfaces are exposed on the opposing sides and bottoms of the source/drain recesses. Since the opposing sides and bottoms of the source/drain recesses include semiconductor surfaces onto which the semiconductor layer for the source/drain regions is epitaxially deposited, the angle of the fourth top surface of each source/drain region relative to the first top surface of the semiconductor fin will be minimized and the risk that the source/drain contacts will not reach the source/drain regions will be reduced (i.e., the risk of unlanded source/drain contacts will also be reduced).

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 5A-5C are different cross-section diagrams of a partially completed structure formed according to the method of FIG. 3;

FIGS. 7A-7C are different cross-section diagrams of a partially completed structure formed according to the method of FIG. 3;

FIGS. 9A-9C are different cross-section diagrams of a partially completed structure formed according to the method of FIG. 3;

FIGS. 10A-10C are different cross-section diagrams of a partially completed structure formed according to the method of FIG. 3;

FIGS. 12A-12C are different cross-section diagrams of a partially completed structure formed according to the method of FIG. 3;

FIGS. 13A-13C are different cross-section diagrams of a partially completed structure formed according to the method of FIG. 3;

FIGS. 21A-21C are different cross-section diagrams of a partially completed structure formed according to the method of FIG. 3.

DETAILED DESCRIPTION

As mentioned above, as fin-type field effect transistor (FINFET) size continues to decrease and FINFET density continues to increase, it can be difficult to form FINFETs without compromising robustness.

Figure 1A:
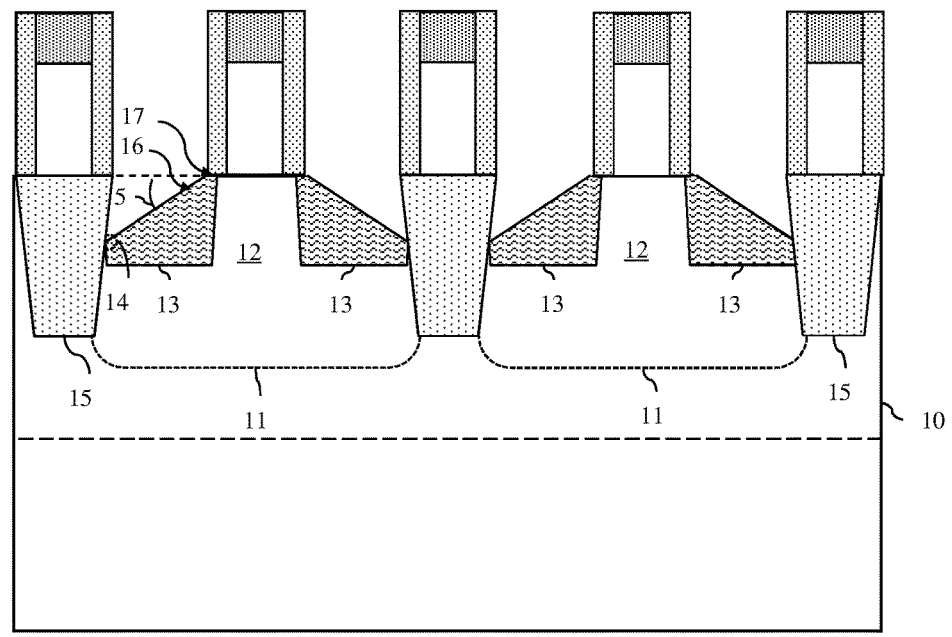
FIG. 1A is a cross-section diagram illustrating formation of source/drain regions adjacent to single-diffusion breaks (SDBs) using conventional fin-type field effect transistor (FINFET) processing techniques.
Figure 1B:
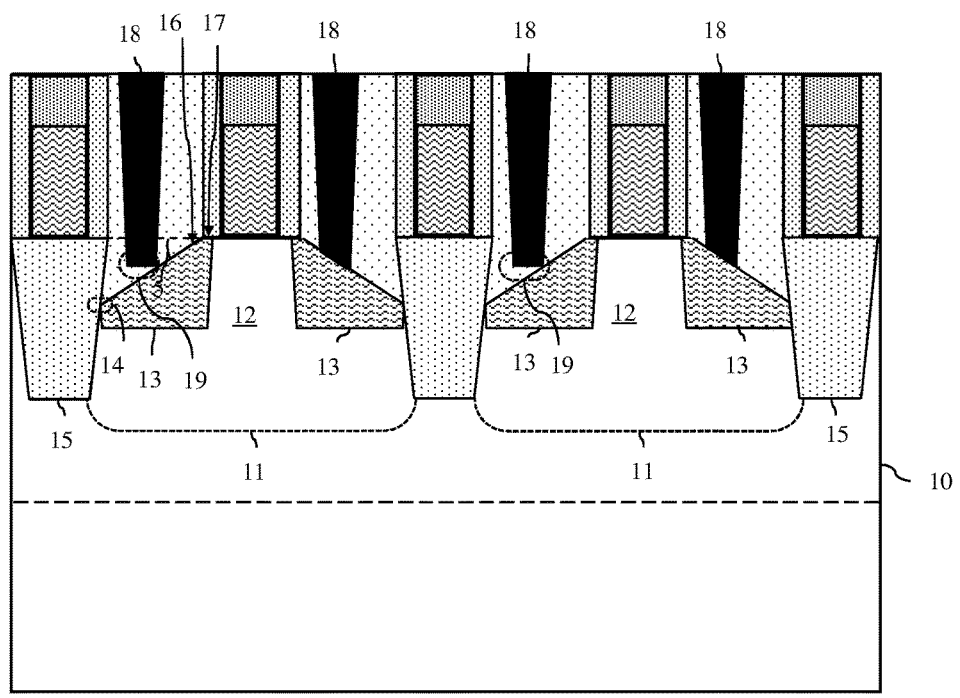
FIG. 1B is a cross-section diagram illustrating possible defects in contacts formed on the source/drain regions of FIG. 1A.

For example, referring to FIGS. 1A-1B, in conventional single-diffusion break (SDB) FINFET processing, a relatively long semiconductor fin 10 is formed on a substrate. Thereafter, portions of the semiconductor fin are removed or cut (e.g., using conventional lithographic patterning and etch processes) to create trenches within the semiconductor fin 10. The trenches are then filled with isolation material to form trench isolation regions 15 (referred to as single-diffusion breaks (SDBs)). The trench isolation regions 15 define one or more active device region(s) 11 within the semiconductor fin 10. Additional processes are then performed in order to form FINFET(s) using the active device region(s) 11. Oftentimes, these additional processes include forming epitaxial source/drain regions 13. That is, source/drain recesses are formed within each active device region 11 on opposing sides of a channel region 12. Subsequently, epitaxial semiconductor material for the epitaxial source/drain regions 13 is grown within each of the source/drain recesses. However, if a source/drain recess is formed immediately adjacent to an adjacent isolation region 15, the exposed surfaces on which the epitaxial semiconductor material is grown within that source/drain recess will include both semiconductor surfaces of the semiconductor fin 10 and an isolation surface of the adjacent isolation region 15. In this case, a facet corner 14 at one end of the top surface 16 of the epitaxial source/drain region 13 will be located deep within the recess (e.g., adjacent the bottom of the recess) near the isolation region 15 and, thus, the top surface 16 of the epitaxial source/drain region 13 will be significantly angled relative to the top surface 17 of the semiconductor fin 10. Unfortunately, when the angle 5 of the top surface 16 of an epitaxial source/drain region 13 is relatively large, landing of a subsequently formed source/drain contact 18 on that top surface can be difficult and can lead to a void 19 between the contact 18 and source/drain region 13 and can, thereby, lead to a defective device (see FIG. 1B).

Figure 2A:
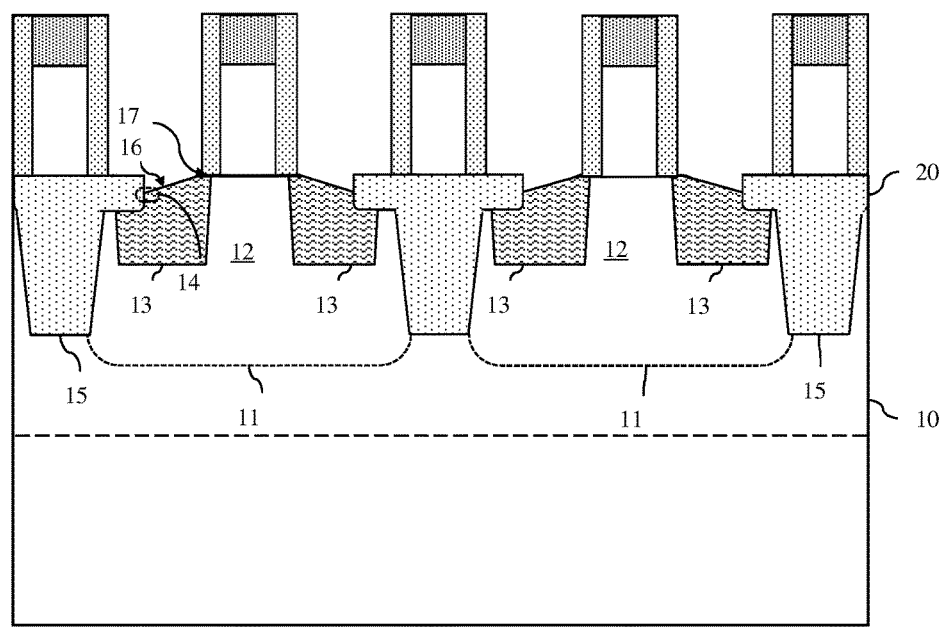
FIG. 2A is a cross-section diagram illustrating formation of source/drain regions adjacent to single-diffusion breaks (SDBs) using alternative FINFET processing techniques.
Figure 2B:
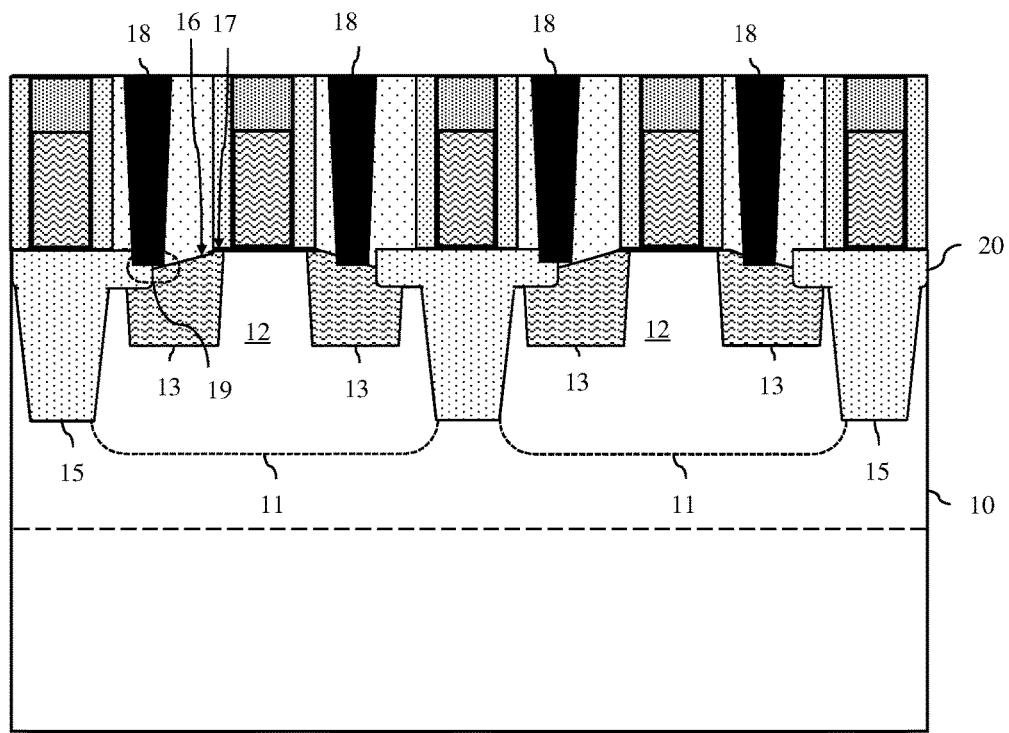
FIG. 2B is a cross-section diagram illustrating possible defects in contacts formed on the source/drain regions of FIG. 2A.

Referring to FIGS. 2A-2B in order to minimize the risk of unlanded source/drain contacts (as described above), silicon dioxide bumps 20 can be formed above the isolation regions 15. These silicon dioxide bumps 20 can be wider than the isolation regions 15 such that the outer edges of each silicon dioxide bump 20 will extend laterally beyond the sidewalls of the isolation region below. Thus, when the source/drain recesses are etched, the semiconductor material adjacent to the sidewalls of the isolation regions 15 is protected. Consequently, the exposed surfaces on which the epitaxial semiconductor material is grown within each source/drain recess will include semiconductor surfaces on the opposing sides and the bottom of that recess. In this case, the facet corner 14 at the end of the top surface 16 of the epitaxial source/drain region 13 near the isolation region 15 will be located closer to the top of the recess and, thus, the top surface 16 of the epitaxial source/drain region 13 will be less angled relative to the top surface 17 of the semiconductor fin 10, thereby minimizing the occurrence of a void 19 between the source/drain contact and the source/drain region 13 below (i.e., thereby minimizing the risk of an unlanded contact) (see FIG. 2B). Unfortunately, the presence of silicon dioxide bumps 20 reduces the size of each contact area at the top surface of each source/drain region and, thereby increases the risk of defects due to overlay errors. Furthermore, although processing techniques have been developed that expose the sidewalls of the semiconductor fin prior to gate structure formation and that essentially simultaneously reduce the size of the silicon dioxide bumps 20 and, thereby increase the size of the contact area, these processing techniques provide little control over the final shape of the silicon dioxide bumps. Specifically, these processing techniques use a combination of both vertical and lateral etching, which can lead to silicon dioxide bumps that have significantly curved sidewalls and smaller gate landing areas. The curved sidewalls and smaller gate landing areas can result in all various conditions that can impact device robustness including, for example, functioning gates that land on portions of the silicon dioxide bumps, non-functioning gates that land on the silicon dioxide bumps and adjacent source/drain regions, and excessively large divots in the top surface of the semiconductor fin.

In view of the foregoing, disclosed herein is a method of forming a semiconductor structure that includes one or more fin-type field effect transistors (FINFETs) and one or more single-diffusion break (SDB) type isolation region(s) that provide isolation for the FINFET(s). In the method, trench isolation region(s) (e.g., SDBs) can be formed within a semiconductor fin; an isolation bump (e.g., a silicon dioxide bump) can be formed above each trench isolation region; and sidewall spacers can be formed on each isolation bump. During a subsequent etch process to reduce the height of the isolation bump(s) and to remove isolation material from the sidewalls of the semiconductor fin, the sidewall spacers prevent any lateral etching of the isolation bump(s), thereby providing control over the final shape of the isolation bump(s). Furthermore, during a subsequent etch process to form source/drain recesses in the semiconductor fin, the sidewalls spacers protect the semiconductor material adjacent to each trench isolation region. Consequently, each source/drain recess will have opposing sides and a bottom that include semiconductor surfaces and the angle of the top surfaces of epitaxial source/drain regions, which are subsequently formed within the source/drain recesses, relative to the top surface of the semiconductor fin will be minimized. Thus, the risk that subsequently formed source/drain contacts will not reach the source/drain regions will be reduced (i.e., the risk of unlanded source/drain contacts will also be reduced). Also disclosed herein is a semiconductor structure formed according to the method.

Figure 3:
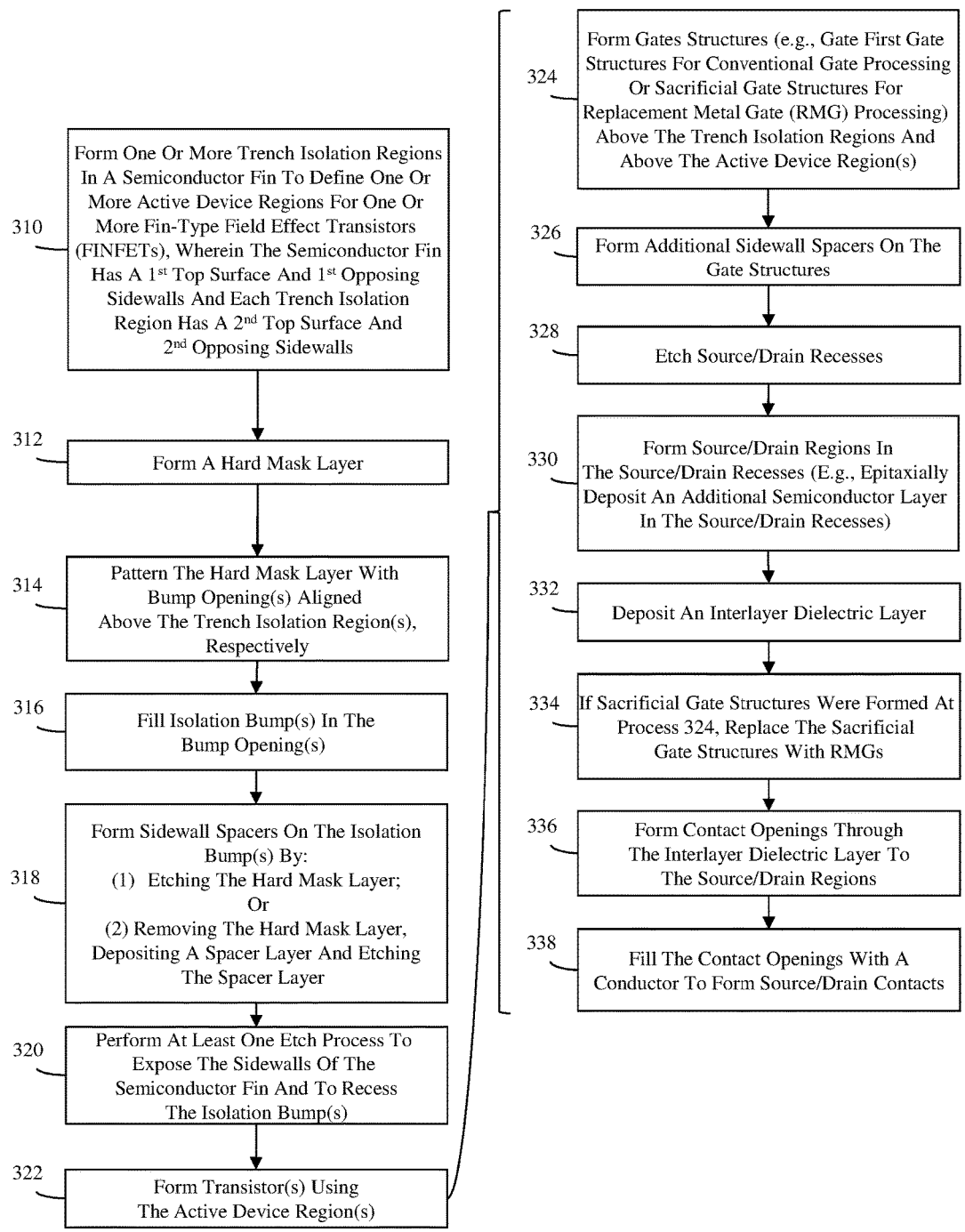
FIG. 3 is a flow diagram illustrating a method of forming a semiconductor structure, which includes one or more fin-type field effect transistors (FINFETs) and one or more single-diffusion break (SDB) type isolation region(s)

More particularly, referring to the flow diagram of FIG. 3, disclosed herein is a method of forming a semiconductor structure, which includes one or more fin-type field effect transistors (FINFETs) and one or more single-diffusion break (SDB) type isolation region(s) that define the active device region(s) for the FINFET(s) and that provide isolation for the FINFET(s).

The method can include providing a semiconductor wafer. The semiconductor wafer can be a bulk semiconductor wafer. Alternatively, the semiconductor wafer can be, for example, a semiconductor-on-insulator wafer (e.g., a silicon-on-insulator (SOI) wafer or any other suitable semiconductor-on-insulator wafer) (not shown). Such a semiconductor-on-insulator wafer can include a substrate (e.g., a silicon substrate or any other suitable substrate including, but not limited to, a silica glass substrate or a silicon carbide (SiC) substrate), an insulator layer (e.g., a buried oxide (BOX) layer or other suitable insulator layer) on the substrate and a semiconductor layer on the insulator layer. In any case, the bulk semiconductor wafer or, if applicable, the semiconductor layer of the semiconductor-on-insulator wafer) can be made of a first semiconductor material (e.g., silicon or some other suitable monocrsytalline semiconductor material).

Figure 4A:
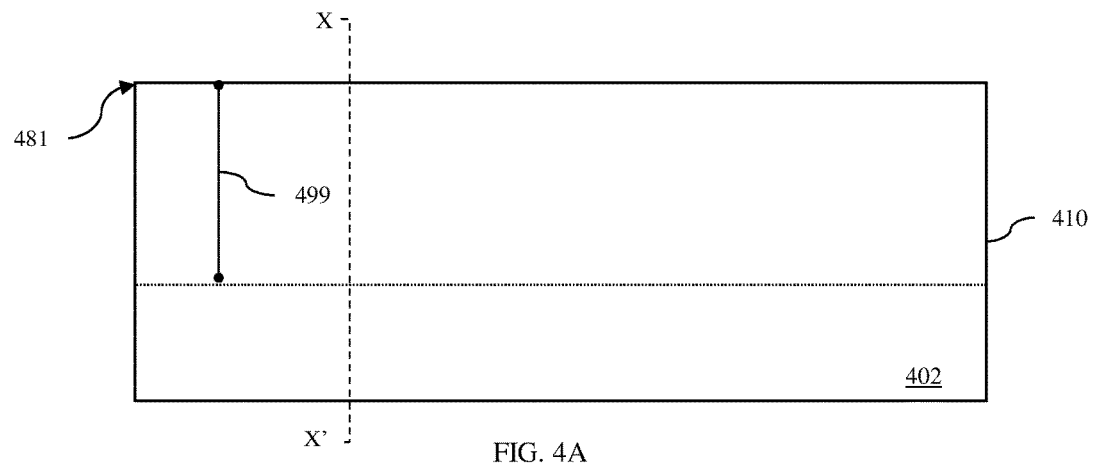
FIGS. 4A-4B are different cross-section diagrams of a partially completed structure formed according to the method of FIG. 3.
Figure 4B:
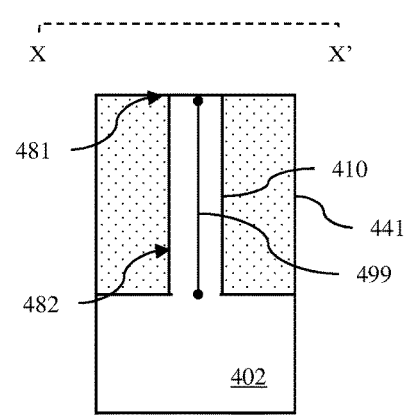

The method can further include forming at least one semiconductor fin 410 on the semiconductor wafer (see FIGS. 4A-4B). For purposes of this disclosure a semiconductor fin refers to a relatively tall and thin, elongated, semiconductor body that is essentially rectangular in shape. The semiconductor fin 410 can be formed the upper portion of the bulk semiconductor wafer 402, as illustrated, (or from the semiconductor layer of a semiconductor-on-insulator wafer) using, for example, conventional lithographic patterning techniques or sidewall image transfer (SIT) techniques. Thus, the semiconductor fin 410 will be made of the first semiconductor material (e.g., silicon or some other suitable monocrsytalline semiconductor material). In any case, the semiconductor fin 410 can have a first top surface 481, first opposing sidewalls 482 and a height 499. It should be noted that the semiconductor fin 410 could be doped, either before or after formation, so that channel region(s), which will be located within the semiconductor fin 410, have an appropriate type conductivity at a relatively low conductivity level. For example, for a P-type FINFET, the semiconductor fin 410 can have an N− conductivity; whereas, for an N-type FINFET, the semiconductor fin 410 can have a P− conductivity. Alternatively, the semiconductor fin 410 can be undoped. For purposes of illustration, a single semiconductor fin 410 is illustrated. However, it should be illustrated that the semiconductor structure could be formed so as to have multiple essentially parallel semiconductor fins.

A first isolation layer 441 can be deposited over the partially completed structure and a polishing process (e.g., a chemical mechanical polishing (CMP) process) can be performed in order to expose the first top surface 481 of the semiconductor fin 410 (see FIG. 4B).

Thus, the first isolation layer 441 will be formed adjacent to the first opposing sidewalls 482 of the semiconductor fin 410 (and, if applicable, will fill the spaces between adjacent semiconductor fins). The first isolation layer 441 can be, for example, a layer of silicon dioxide. Alternatively, the first isolation layer 441 can include one or more layers of any suitable isolation material (e.g., silicon dioxide, silicon oxycarbide, etc.).

One or more trenches 450 can subsequently be formed in the semiconductor fin 410 (see FIGS. 5A-5C). Specifically, conventional lithographic patterning and selective etch techniques can be performed to form one or more trenches 450. For example, a single trench 450 can be formed in the semiconductor fin 410 so as to be positioned laterally adjacent to at least one active device region 411 for a fin-type field effect transistor (FINFET). Alternatively, one or more pairs of adjacent trenches 450 can formed in the semiconductor fin 410 to define the boundaries of active device regions 411 for corresponding FINFETs (as illustrated). In any case, each trench 450 can have a first depth 498, as measured from the first top surface 481 of the semiconductor fin 410, and a first width 497, as measured at the first top surface 481 of the semiconductor fin 410 in a direction perpendicular to the width of the semiconductor fin 410 (see FIG. 5A). The first depth 498 can be equal to or less than the height 499 of the semiconductor fin 410. Additionally, each trench 450 can cut across the full width of the semiconductor fin 410 to the first isolation layer 441 on the first opposing sidewalls 482 of the semiconductor fin 410 (see FIG. 5C).

Figure 6A:
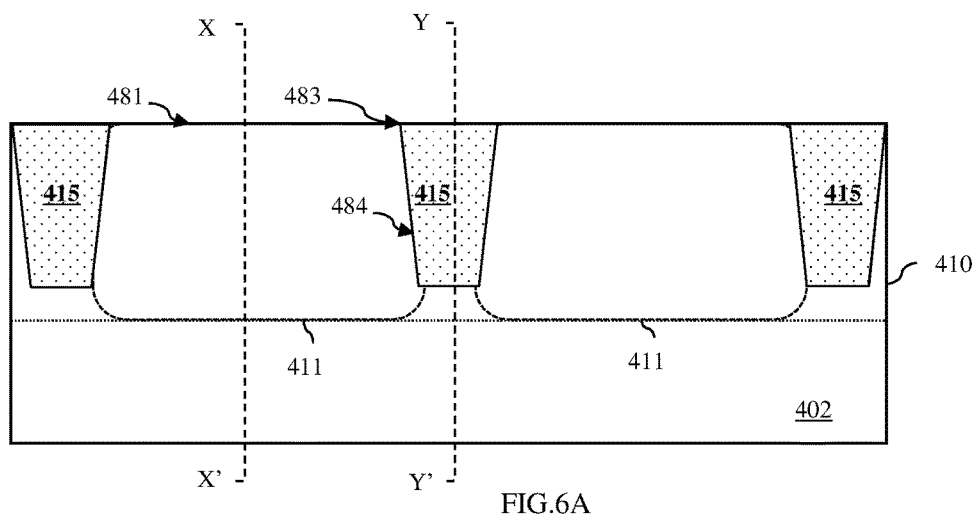
FIGS. 6A-6C are different cross-section diagrams of a partially completed structure formed according to the method of FIG. 3.
Figure 6B:
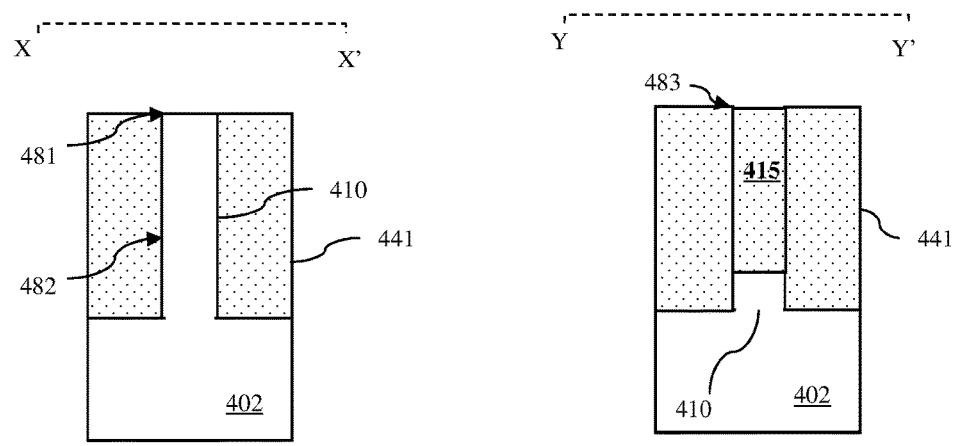
Figure 6C:
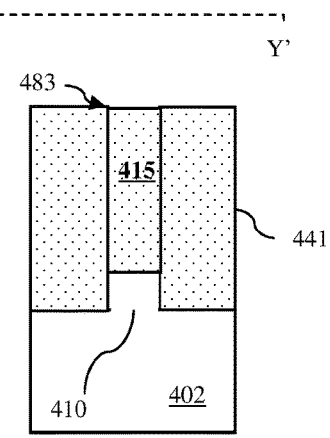

One or more trench isolation regions 415 can then be formed in the trenches 450 (310, see FIGS. 6A-6C). Specifically, a second isolation layer 442 can be deposited so as to fill the trench(es) 450. The second isolation layer 442 can be, for example, a layer of silicon dioxide. Alternatively, the second isolation layer 442 can include one or more layers of any suitable isolation material (e.g., silicon dioxide, silicon oxycarbide, etc.). The second isolation layer 442 can be made of the same isolation material(s) as the first isolation layer 441. Alternatively, the second isolation layer 442 can be made of different isolation material(s) than the first isolation layer 441.

Alternatively, instead of performing discrete patterning and etch processes to form the semiconductor fin 410 and trench(es) 450, as described above an illustrated in FIGS. 4A-4B and 5A-5C, mask patterns for both the semiconductor fin 410 and trench(es) 450 can be formed and the upper portion of the bulk semiconductor wafer 402 (or the semiconductor layer of a semiconductor-on-insulator wafer) can be etched in a process that essentially simultaneously forms a semiconductor fin 410 and one or more trench(es) 450 in the semiconductor fin and extending across the full width of the semiconductor fin 410 (see FIGS. 7A-7C). In this case, at process 310, the first isolation layer 441 is deposited so that it is positioned laterally adjacent to and covers the first opposing sidewalls 482 of the semiconductor fin 410 (and, if applicable, will fill the spaces between adjacent semiconductor fins) and further so that it fills the one or more trenches 450, thereby forming one or more trench isolation regions 415. As mentioned above, the first isolation layer 441 can include one or more layers of any suitable isolation material (e.g., silicon dioxide, silicon oxycarbide, etc.).

Next, a polishing process (e.g., a CMP process) can be performed to expose the first top surface 481 of the semiconductor fin 410 and complete the trench isolation region(s) 415. Thus, each trench isolation region 415 will have a second top surface 483, which is approximately level with the first top surface 481 of the semiconductor fin 410, and will further have second opposing sidewalls 484 within the semiconductor fin 410.

Figure 8A:
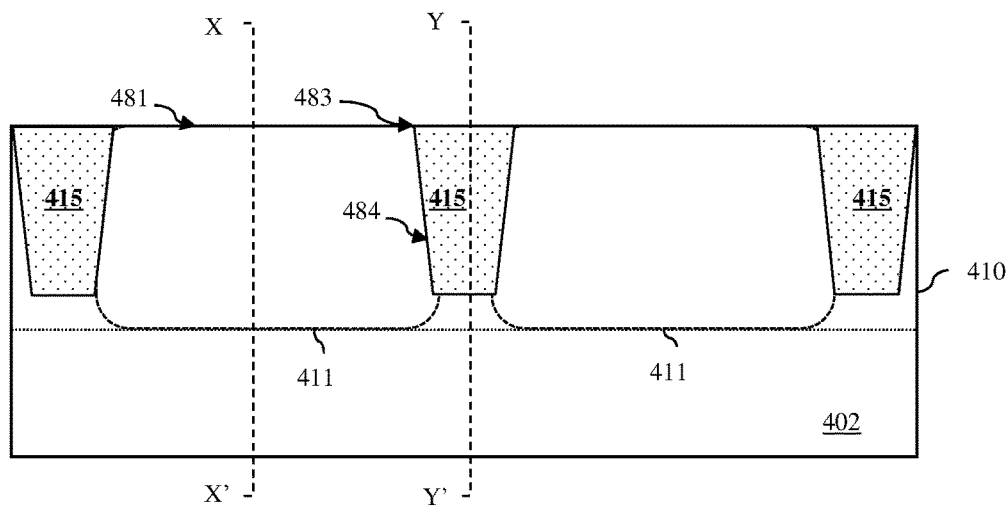
FIGS. 8A-8C are different cross-section diagrams of a partially completed structure formed according to the method of FIG. 3.
Figures 8B, 8C:
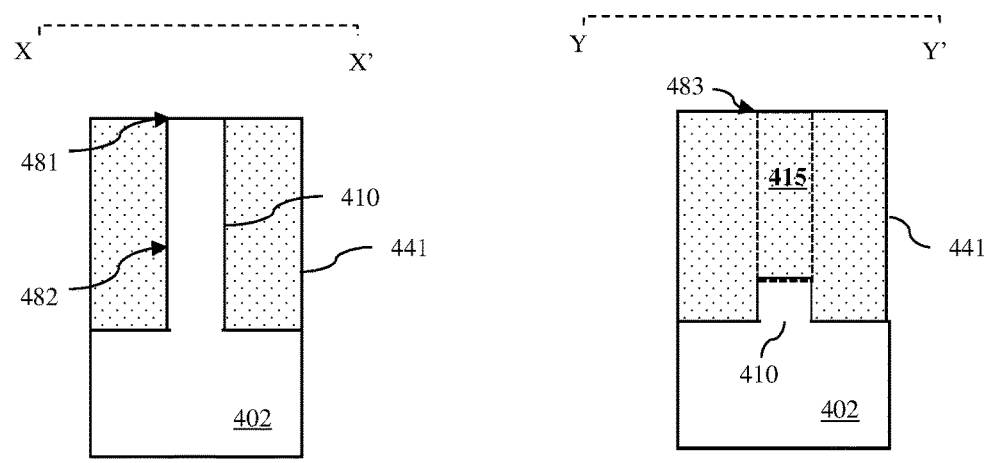

For purposes of illustration, the remaining process steps are described below and illustrated in the Figures with respect to the partially completed structure shown in FIGS. 8A-8C.

Subsequently, a hard mask layer can be formed over the partially completed structure and, particularly, on the first isolation layer 441 located on the first opposing sidewalls of the semiconductor fin and further extending laterally over the first top surface 481 of the semiconductor fin 410 and over the second top surface 483 of each trench isolation region 415 (312). The hard mask layer can be, for example, a silicon nitride hard mask layer. Alternatively, the hard mask layer can be made of any other suitable hard mask material that is different from the materials used for both the first isolation layer 441 and a subsequently deposited additional isolation layer 443, discussed in greater detail at process 318 below.

Next, one or more bump openings 451 can be formed in the hard mask layer above the one or more trench isolation regions 415, respectively (314, see FIGS. 9A-9C). Specifically, lithographic patterning and etch processes can be performed in order to form bump opening(s) 451. Each bump opening 451 can extend essentially vertically through the hard mask layer to a trench isolation region 415 below such that, within each bump opening 451, the second top surface 483 of a trench isolation region 415 is exposed at the bottom of the bump opening 451 (see FIGS. 9A and 9C). The bump opening 451 and trench isolation region 415 below can be approximately vertically aligned and can have approximately equal widths, as illustrated. Alternatively, the width of the bump opening 451 can be slightly greater or slightly less than that of the trench isolation region 415 below. Additionally, each bump opening 451 can be adjacent to at least one mask region 430 (i.e., a remaining portion of the mask layer), which is aligned above an active device region 411 within the semiconductor fin 410 and which extends laterally beyond the first opposing sidewalls 482 of the semiconductor fin 410 onto the adjacent first isolation layer 441 (see FIGS. 9A and 9B). It should be noted that the etch used to form the bump opening(s) 451 can stop on the second top surface 483 of the trench isolation region 415, which is essentially co-planar with the first top surface 481 of the semiconductor fin 410 (as illustrated). Alternatively, the second top surface 483 can be etched back slightly.

An additional isolation layer 443 can then be deposited so as to fill the one or more bump openings 451, thereby forming one or more isolation bumps 425 on the one or more trench isolation regions 415, respectively (316, see FIGS. 10A-10C). The additional isolation layer 443 can be, for example, a layer of silicon dioxide such that the isolation bump(s) are silicon dioxide bump(s). Alternatively, the additional isolation layer 443 can include one or more layers of any suitable isolation material (e.g., silicon dioxide, silicon oxycarbide, etc.). In any case, the additional isolation layer 443 can be made of either the same isolation material as the first isolation layer 441 or, alternatively, can be made of a different isolation material. It should be noted that, if the isolation material of the additional isolation layer 443 is different than that of the first isolation layer 441, then it must be preselected to have specific etch properties (see detailed discussion about below at process 320). Next, a polishing process (e.g., a CMP process) can be performed to remove the additional isolation layer 443 from above the top of the mask regions 430 such that each isolation bump 425 has a third top surface 485, which is approximately level with the top of the mask regions 430, and third opposing sidewalls 486.

Figure 11:
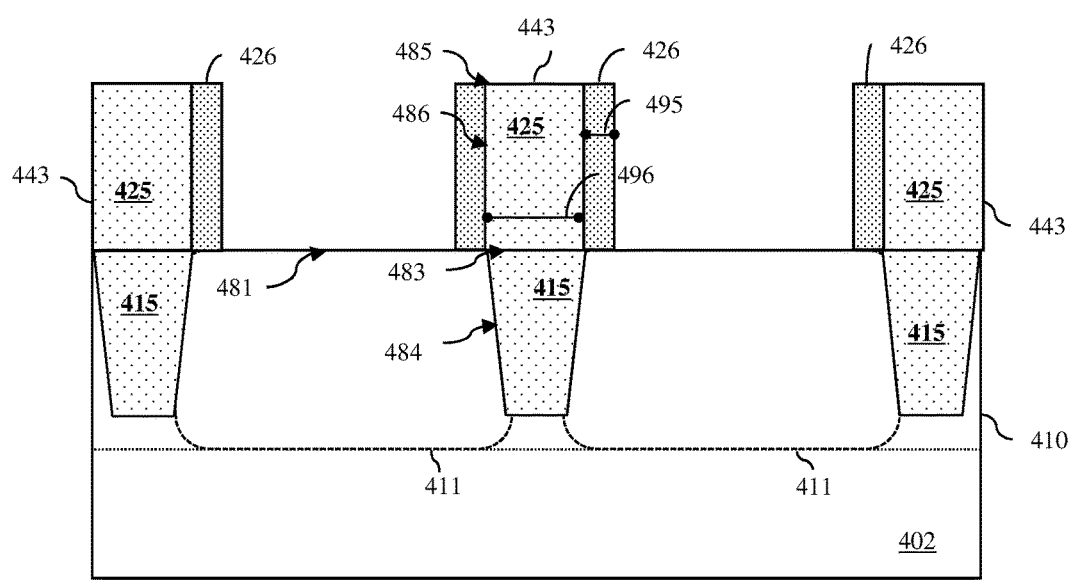
FIG. 11 is a cross-section diagram of a partially completed structure formed according to the method of FIG. 3.

After the isolation bump(s) 425 are formed above the trench isolation region(s) 415, respectively, sidewall spacers 426 can be formed on the third opposing sidewalls 486 of each isolation bump 425 (318, see FIG. 11). The sidewall spacers 426 can be formed, for example, using the hard mask layer as the spacer layer. Specifically, a dry etch process can be performed in order to remove portions of the hard mask layer (i.e., portions of the mask regions 430) from horizontal surfaces of the isolation bump(s) 425 and the semiconductor fin 410 such that the only remaining portions of the hard mask layer (i.e., the only remaining portions of the mask regions 430) are positioned laterally adjacent to vertical surfaces of the isolation bump(s), thereby forming the sidewall spacers 426. Alternatively, the sidewall spacers 426 can be made by completely removing (i.e., stripping) the remaining portions of the hard mask layer and, particularly, the mask regions 430 (e.g., using a selective wet etch process). Then, conventional sidewall spacer formation techniques can be used. That is, a conformal dielectric spacer layer can be deposited over the partially completed structure and an anisotropic etch process can be performed in order to remove portions of the conformal dielectric spacer layer from horizontal surfaces of the isolation bump (s) 425 and the semiconductor fin 410 such that the only remaining portions of the conformal spacer layer are positioned laterally adjacent to vertical surfaces of the isolation bump(s), thereby forming the sidewall spacers 426.

Regardless of whether the hard mask layer or a conformal dielectric spacer layer is used to form the sidewall spacers 426 at process 318, the material of the sidewall spacers 426 should be a dielectric material that is different from the isolation material used for at least the first isolation layer 441 and the additional isolation layer 443. Furthermore, a combination of the width 496 of a given isolation bump 425 and the widths 495 of the sidewall spacer 426 thereon should be such that at least outer portions of the sidewall spacers 426 are above and immediately adjacent to the first top surface 481 of the semiconductor fin 410 (i.e., such that at least outer portions of the sidewall spacers 426 extend laterally some predetermined distance beyond the second opposing sidewalls 484 of the trench isolation region 415 below).

Subsequently, an etch process can be performed to expose the first opposing sidewalls 482 of the semiconductor fin 410 and to essentially simultaneously recess the third top surface 485 of each isolation bump 425 (320, see FIGS. 12A-12C). Specifically, the etch process can be performed in order to selectively etch the isolation material of the first isolation layer 441 and the isolation bump(s) 425 over the semiconductor material of the semiconductor fin 410 and further over the dielectric material of the sidewall spacers 426, thereby exposing the first opposing sidewalls 482 of the semiconductor fin 410 at each active device region 411 and also recessing the third top surface 485 of each isolation bump 425. One or more etch techniques can be used at process 320 alone and/or in combination. For example, if the first isolation layer 441 and the additional isolation layer 443 are made of silicon dioxide, a radial line slot antenna (RLSA) plasma etch technique can be performed, followed a chemical oxide removal (COR) technique and/or a Siconi™ dry chemical etch technique. In any case, the sidewall spacers 426, which are made of a different material than the first isolation layer 441 and additional isolation layer 443, are not etched during process 320 such that the height of each isolation bump 425 will be less than that of the adjacent sidewall spacers 426. Furthermore, these sidewall spacers 426 prevent lateral etching of the isolation bump(s) 425 (i.e., prevent etching back of the third opposing sidewalls 486). By preventing etching of the sidewall spacers 426 and lateral etching of the isolation bump(s) 425, the method controls the final shape of each isolation bump 425 and further controls the predetermined distance by which the outer edge of a sidewall spacer 426 extends laterally beyond a second opposing sidewall 484 of a trench isolation region 415 below and onto the first top surface 481 of the semiconductor fin 410.

Each active device region(s) 411 can then be used to form a corresponding FINFET (322).

To form the FINFET(s) at process 322, gate structures can be formed on the partially completed structure (324, see FIGS. 13A-13C). The gate structures formed at process 324 can include a gate structure 460 on the first top surface 481 and on the first opposing sidewalls 482 of the semiconductor fin 410 at each channel region 412 (e.g., essentially centered between a pair of adjacent trench isolation regions 415) and a gate structure 460' on the third top surface 485 of each isolation bump 425.

The gate structures 460/460' formed at process 324 can be sacrificial gate structures, which are to be used as placeholders for subsequent replacement metal gate (RMG) processing (discussed in greater detail below at process 334). To form sacrificial gate structures, a sacrificial gate stack can be formed on the partially completed structure. In one exemplary embodiment the sacrificial gate stack can include: a thin sacrificial oxide layer; a sacrificial polysilicon layer, a sacrificial amorphous silicon layer or a sacrificial layer of some other suitable sacrificial material on the sacrificial oxide layer; and a sacrificial gate cap layer, such as a sacrificial silicon nitride gate cap layer. Lithographic patterning and etch processes can then be performed in order to form, from this sacrificial gate stack, sacrificial gates 461, each having a sacrificial gate cap 463 (as illustrated).

Alternatively, the gate structures 460/460' formed at process 324 can be conventional gate-first gate structures. To form gate-first gate structures, a gate-first gate stack can be formed on the partially completed structure. In one exemplary embodiment, the gate-first gate stack can include: a gate dielectric layer, such as a silicon dioxide gate dielectric layer; a gate conductor layer, such as a polysilicon gate conductor layer, on the gate dielectric layer; and a gate cap layer, such as a silicon nitride gate cap layer, on the gate conductor layer. Lithographic patterning and etch processes can then be performed in order to form, from this gate stack, gate-first gates, each having a gate cap.

Figure 14:
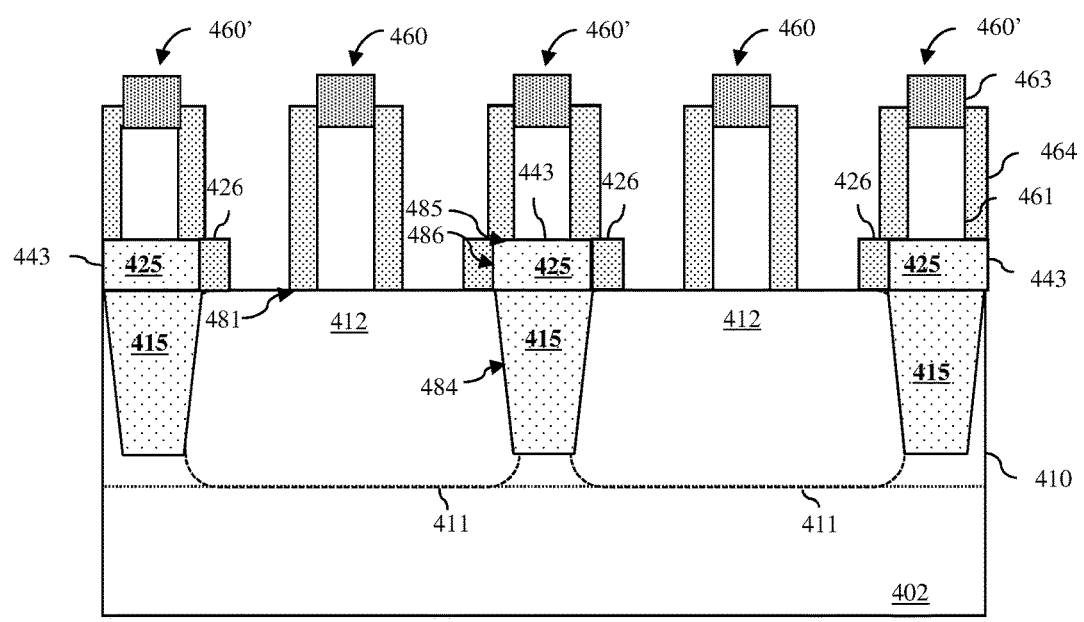
FIGS. 14-20 are cross-section diagrams illustrating partially completed structures, respectively, formed according to the method of FIG. 3.

In any case, additional sidewall spacers 464 and, particularly, gate sidewall spacers can be formed on the sidewalls of the gate structures 460/460' (326, see FIG. 14). To form the additional sidewall spacers 464, a relatively thin conformal dielectric spacer layer (e.g., a relatively thin conformal silicon nitride spacer layer) can be deposited over the partially completed structure. An anisotropic etch process can then be performed so as to remove the conformal dielectric spacer layer from horizontal surfaces, thereby forming the additional sidewall spacers 464 on the essentially vertical surfaces of the gate structures 460/460'. If the sidewall spacers 426 on each isolation bump 425 and the additional sidewall spacers 464 on the gate structures 460/460' are made of the same dielectric material (e.g., silicon nitride), then, as the dielectric spacer layer for the additional sidewall spacers 464 is etched, the height of the sidewall spacers 426 will also be reduced (as illustrated).

Figure 15:
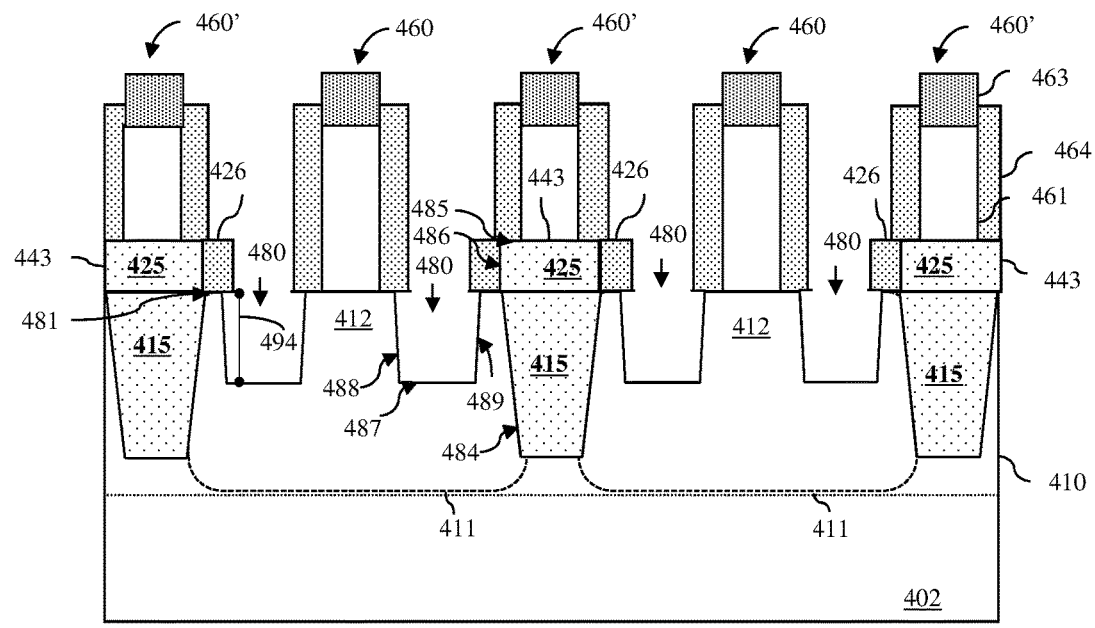

Source/drain recesses 480 for the FINFET(s) can then be formed in the active device region(s) 411 of the semiconductor fin 410 on opposing sides of the gate structures 460 (328, see FIG. 15). To form the source/drain recesses 480, a selective anisotropic etch process can be used to selectively etch the exposed material of the semiconductor fin 410 over the material of the sidewall spacers 426, 464 and the gate caps 463. Due to the distance by which the sidewall spacers 426 extend laterally beyond the second opposing sidewalls 484 of the trench isolation region 415 and onto the first top surface 481 of the semiconductor fin 410, the sidewall spacers 426 protect the areas of the semiconductor fin 410 adjacent to the second opposing sidewalls 484 of each trench isolation region 415. Thus, each source/drain recess 480 will have a first side 488 adjacent to a channel region 412, a second side 489 opposite the first side 488 adjacent to, but physically separated from, a trench isolation region 415 and a bottom 487. The bottom 487 of each source/drain recess 480 can be at a second depth 494, which is less than the first depth 498 of the trench(es) formed for the trench isolation region(s) 415.

Figure 16:
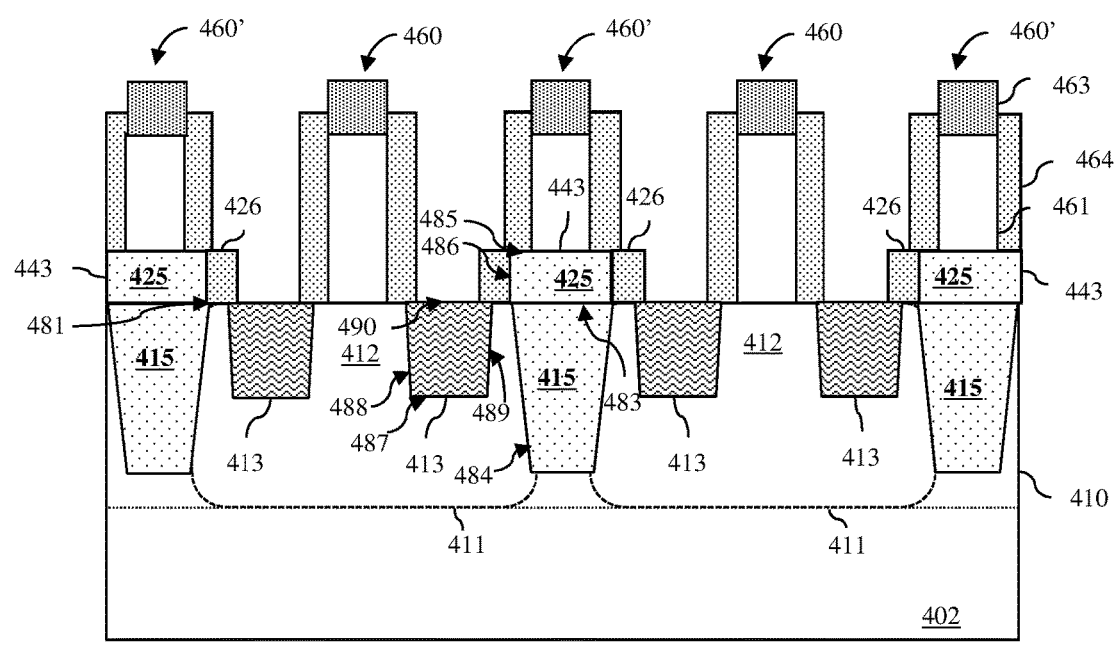

Source/drain regions 413 can then be formed within the source/drain recesses 480 (330, see FIG. 16). The source/drain regions 413 can be formed, for example, by epitaxially depositing a semiconductor layer in the source/drain recesses 480. The semiconductor layer can be in-situ doped so as to have the appropriate type conductivity at a relatively high conductivity level. For example, for a P-type FINFET, the semiconductor layer can be in-situ doped with a P-type dopant so as to have P+ conductivity; whereas, for an N-type FINFET, the semiconductor layer can be in-situ doped with an N-type dopant so as to have N+ conductivity. The semiconductor layer can be made of the same first semiconductor material as that used for the semiconductor fin 410 (e.g., silicon). Alternatively, the semiconductor layer can be made of a second semiconductor material that is different from the first semiconductor material. The type of second semiconductor material used may be preselected to enhance FINFET performance and may vary depending upon whether the FINFET being formed is a P-type FINFET or an N-type FINFET. For example, for a P-type FINFET, the semiconductor layer can be a silicon germanium (SiGe) layer, which will enhance majority charge carrier mobility within the P-type FINFET's channel region and, thereby enhance performance. For an N-type FINFET, the semiconductor layer can be a silicon carbide (SiC) layer, which will enhance majority charge carrier mobility within the N-type FINFET's channel region and, thereby enhance performance.

In any case, since each source/drain recess 480 is physically separated from the adjacent trench isolation region 415, semiconductor surfaces will be exposed, not only at the first side 488 adjacent to the channel region 412 and at the bottom 487, but also at the second side 489 (i.e., adjacent to the trench isolation region 415). Consequently, when a semiconductor layer is epitaxially deposited into a source/drain recess 480 to form a source/drain region 413, the semiconductor layer will grow on the bottom 487 and on both sides 488-489 of that recess. Thus, each source/drain region 413 will have a fourth top surface 490 and the angle of that fourth top surface 490 relative to the first top surface 481 of the semiconductor fin 410 will be minimized. For example, the fourth top surface 490 of each source/drain region 413 can be approximately parallel to and level with or higher than the first top surface 481 of the semiconductor fin 410.

Following formation of the source/drain regions 413, additional processing can be performed in order to complete the semiconductor structure 400 (332-338).

Figure 17:
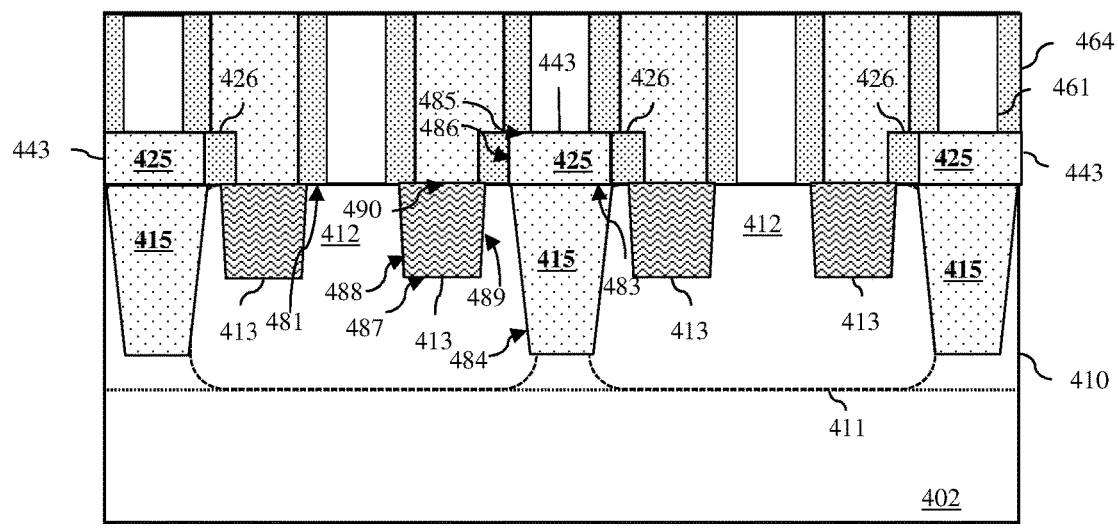

For example, a blanket interlayer dielectric (ILD) layer 444 can be deposited over the partially completed structures (332, see FIG. 17). The ILD layer 444 can be, for example, a silicon oxide layer or one or more layers of any suitable ILD material(s) (e.g., silicon dioxide, silicon nitride, borophosphosilicate glass (BPSG), tetraethyl orthosilicate (TEOS), fluorinated tetraethyl orthosilicate (FTEOS), etc.).

Figure 18:
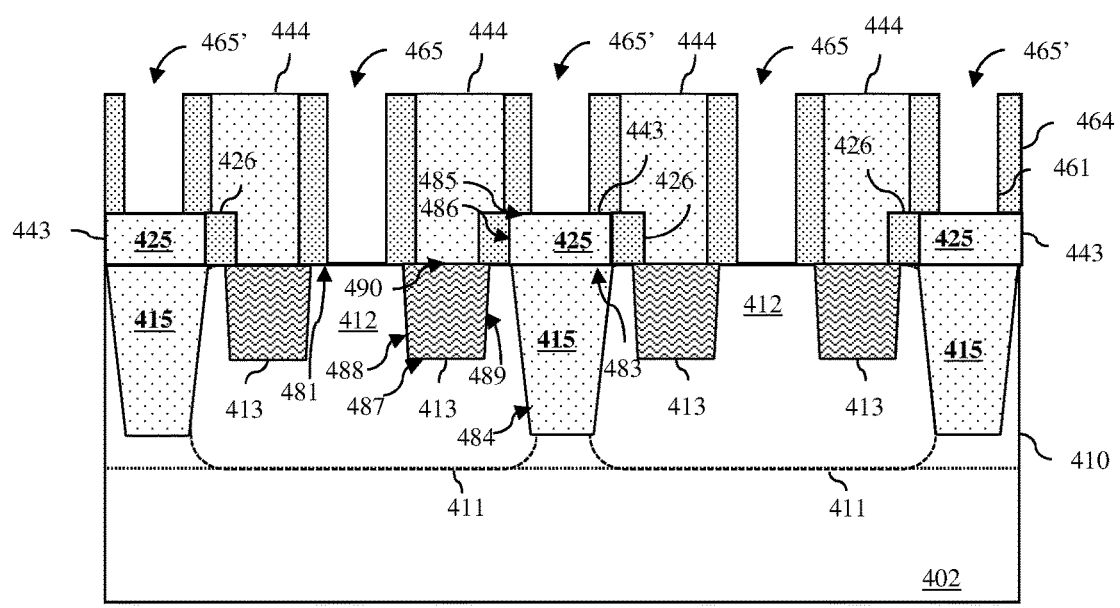

Additionally, if the gate structures 460/460' formed at process 324 were sacrificial gate structures, as opposed to gate-first gate structures, a polishing process (e.g., a CMP process) can be performed to expose the tops of the sacrificial gates 461 (i.e., to remove the sacrificial gate caps 463) from each of the gate structures 460/460'. Then, the sacrificial gates 461 can be selectively removed to create gate openings 465/465' (see FIG. 16) and the gate openings 465/465' can be filled with replacement metal gates (RMGs) 470/470' (334, see FIG. 18).

Figure 19:
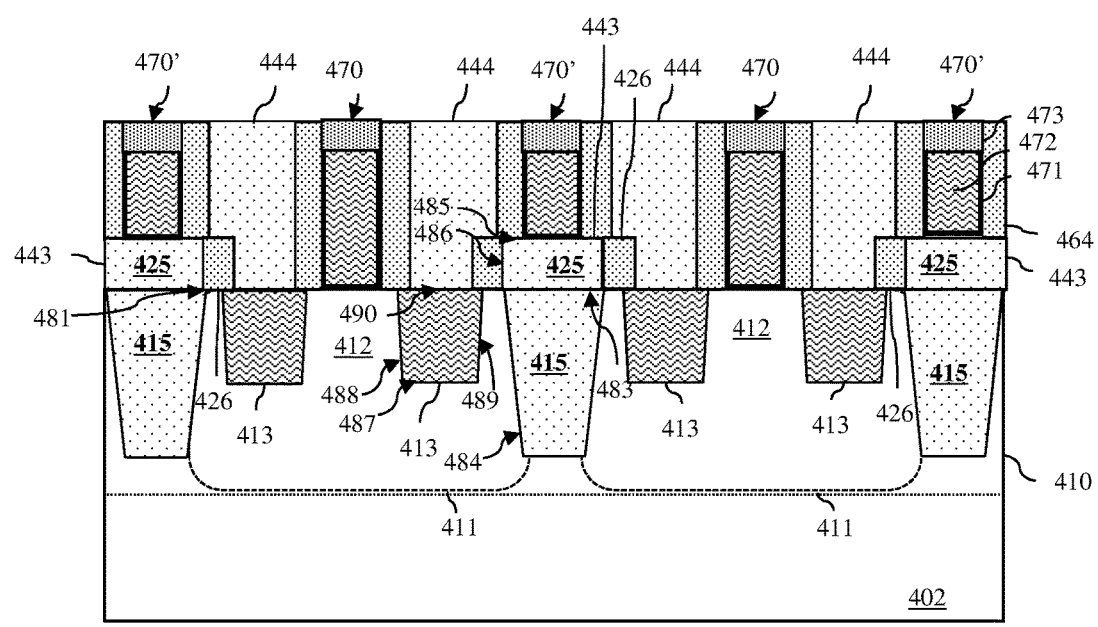

In one exemplary embodiment, replacement of the sacrificial gates with RMGs can be performed as follows. The sacrificial material of the sacrificial gates 461 can be selectively etched over the semiconductor material of the semiconductor fin 410 as well as over the adjacent dielectric materials of the additional sidewall spacers 464 and the ILD layer 444, thereby creating gate openings 465 and 465' in the ILD layer 444 above each channel region 412 and each isolation bump 425. It should be noted that, since each sacrificial gate structure 460 was formed adjacent to the first top surface 481 and first opposing sidewalls 482 of the semiconductor fin 410 at a channel region 412, the corresponding gate opening 465 will expose the first top surface 481 and first opposing sidewalls 482 of the semiconductor fin 410 at a channel region 412. In any case, each gate opening 465/465' will have sidewalls lined with an additional sidewall spacer 464. Replacement metal gates (RMGs) can then be formed in the gate openings. The RMGs can include functional RMG(s) 470 for the FINFET(s) 401 in the gate opening(s) 465 adjacent to the first top surface 481 and first opposing sidewalls 482 the semiconductor fin 410 at the channel region(s) 412 and non-functional RMGs 470' above the isolation bump(s) 425 (see FIG. 19). Exemplary techniques for forming RMGs include conformally depositing a gate dielectric layer 471 so as to line the gate openings 465/465' and, then, depositing a stack of gate conductor layers 472 on the gate dielectric layer 471 in order to fill the gate openings. The stack of gate conductor layers 472 can include, for example, at least one conformal work function metal layer and a conductive fill material layer on the conformal work function metal layer(s).

In RMGs, the conformal gate dielectric layer 471 can be a silicon dioxide gate dielectric layer. Alternatively and preferably, the conformal gate dielectric layer 471 can be a high-K gate dielectric layer. The high-K gate dielectric layer can be, for example, a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The conformal work function metal can include a metal material or metal alloy material that is preselected in order to achieve the optimal gate conductor work function given the conductivity type of the FET. For example, the optimal gate conductor work function of an NFET will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for a PFET will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The conductive fill material layer can be a blanket layer of a metal or a metal alloy, such as tungsten, a tungsten alloy (e.g., tungsten silicide or titanium tungsten), cobalt, aluminum or any other suitable metal or metal alloy. In any case, after the RMG materials are deposited so as to fill the gate openings 465/465', a polishing process (e.g., a CMP process) can be performed in order to remove the RMG materials from above the top surface of the ILD layer 444. Then, the RMG materials within the gate openings can be etched back (i.e., recessed). After the RMG materials are etched back, a dielectric cap layer (e.g., a silicon nitride cap layer) can be deposited and polished (e.g., by CMP) in order to form dielectric caps 473 for the RMGs 470/470'. It should be understood that the techniques described above for forming the RMGs are offered for illustration purposes only and are not intended to be limiting. Alternatively, any other suitable technique for forming RMG could be used.

Figure 20:
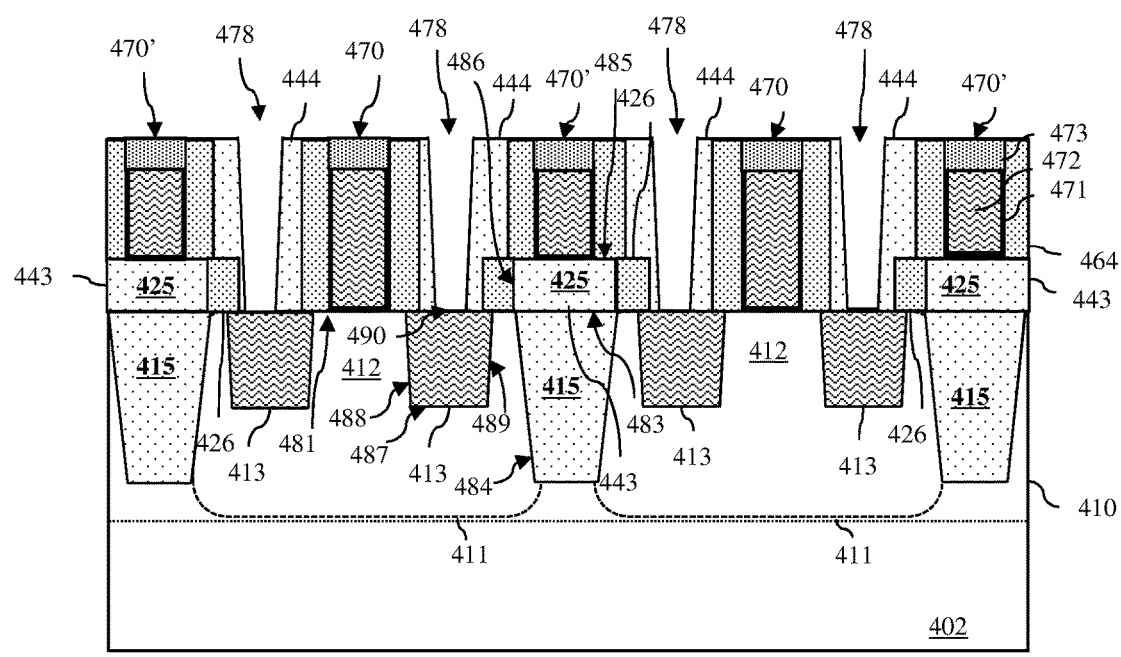

Next, lithographic patterning and etch processes can be performed in order to form contact openings 478 that extend essentially vertically through the ILD layer 444 to the fourth top surfaces 490 of the source/drain regions 413 (336, see FIG. 20). Then, source/drain contacts 418 (also referred to in the art as metal plugs) can be formed in the contact openings 478 (338, see FIGS. 21A-21C). These source/drain contacts 418 can be formed, for example, by optionally depositing one or more conformal layers such as a conformal adhesive layer (e.g., a titanium adhesive layer or other suitable adhesive layer) and/or a conformal barrier layer (e.g., titanium nitride barrier layer or other suitable barrier layer) to line the contact openings and, then, depositing a conductor and, particularly, a metal or metal alloy (e.g., a tungsten, cobalt, aluminum or any other suitable metal plug material) to fill the remaining spaces within the contact openings. In any case, since the angle of the fourth top surface 490 of each source/drain region 413 relative to the first top surface 481 of the semiconductor fin 410 is minimized (as discussed above at process 330), the risk that a contact opening 478 will not reach a source/drain region 413 at process 336 is reduced. Thus, the risk of any unlanded contacts is reduced. That is, the risk that a defect and, particularly, a void will be present between any given source/drain contact 418 formed at process 338 and the source/drain region 413 below is reduced.

Figure 21A:
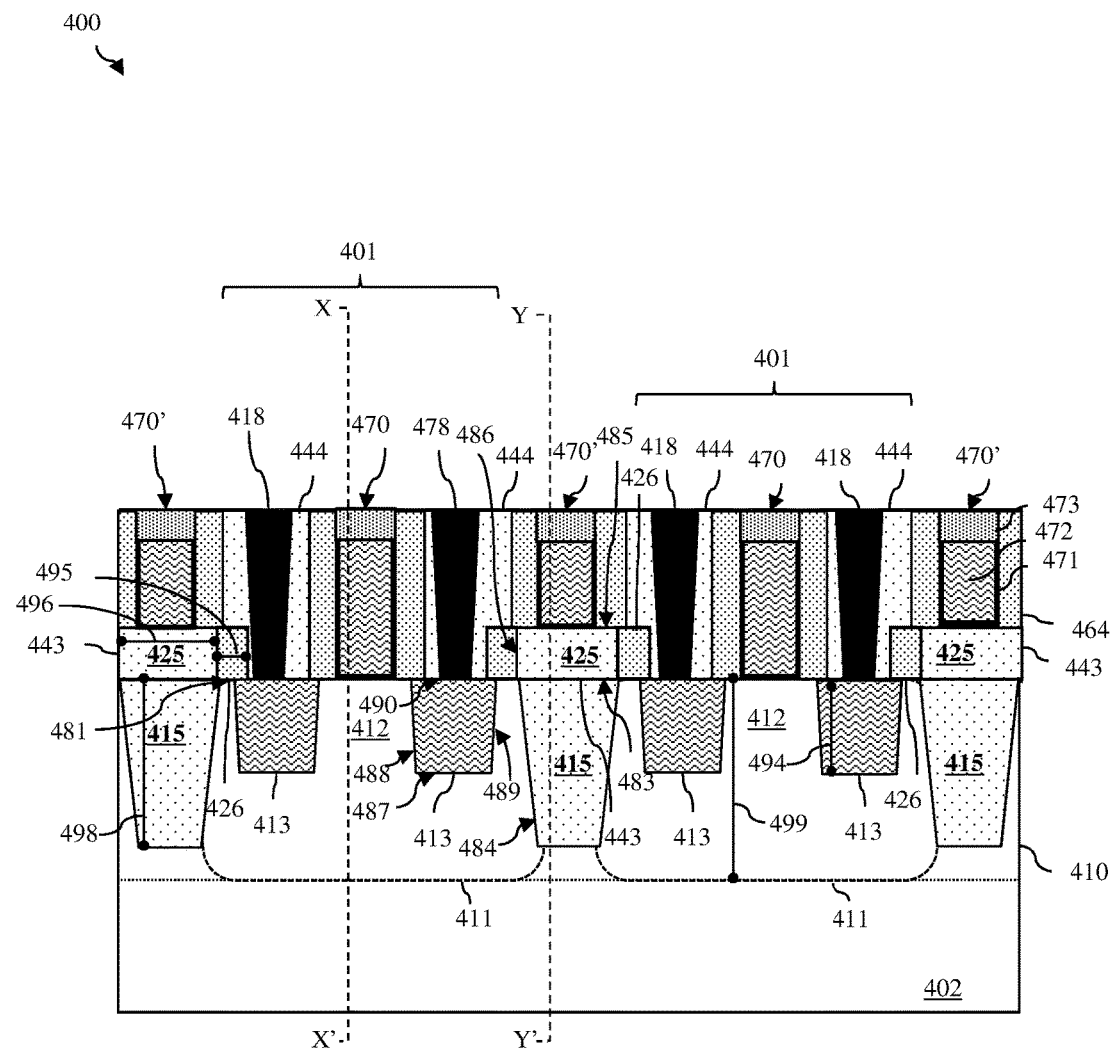

Referring to FIGS. 21A-21C, also disclosed herein are embodiments of a semiconductor structure 400, which includes one or more fin-type field effect transistors (FINFETs) 401 and one or more single-diffusion break (SDB) type isolation regions that provide isolation for the FINFET (s).

The semiconductor structure 400 can include a semiconductor fin 410 on a semiconductor substrate. For example, the semiconductor fin 410 can be formed from an upper portion of a bulk semiconductor wafer 402, as illustrated. Alternatively, the semiconductor fin 410 can be formed from a semiconductor layer of a semiconductor-on-insulator wafer (e.g., a silicon-on-insulator (SOI) wafer or any other suitable semiconductor-on-insulator wafer). In any case, the semiconductor fin can be made of a first semiconductor material (e.g., silicon or some other suitable monocrsytalline semiconductor material). For purposes of this disclosure a semiconductor fin refers to a relatively tall and thin, elongated, semiconductor body that is essentially rectangular in shape. In any case, the semiconductor fin 410 can have a first top surface 481 and first opposing sidewalls 482.

The semiconductor structure 400 can further include a first isolation layer 441 adjacent to the first opposing sidewalls 482 of the semiconductor fin 410. The first isolation layer 441 can be, for example, a layer of silicon dioxide. Alternatively, the first isolation layer 441 can include one or more layers of any suitable isolation material (e.g., silicon dioxide, silicon oxycarbide, etc.).

The semiconductor structure 400 can further include, within the semiconductor fin 410, one or more active device regions 411 for one or more fin-type field effect transistors (FINFETs), respectively, and at least one trench isolation region 415 (e.g., an SDB type isolation region) positioned laterally adjacent to each active device region 411. For example, each active device region 411 can be positioned laterally between a pair of adjacent trench isolation regions 415. Each trench isolation region 415 can include a trench 450 that extends essentially vertically into the semiconductor fin 410 to a first depth 498, that cuts across the full width of the semiconductor fin 410 and that is filled with the same first isolation layer 441 that is adjacent to the first opposing sidewalls 482 of the semiconductor fin 410. Alternatively, as discussed in detail above with regard to the method, each trench 450 can be filled with a second isolation layer 442). In any case, the first depth 498 of each trench 450 can be equal to or less than the height 499 of the semiconductor fin 410 and each trench isolation region 415 can have a second top surface 483 that is approximately level with the first top surface 481 of the semiconductor fin 410 and second opposing sidewalls 484 within the semiconductor fin 410. It should be noted that, as illustrated in FIGS. 21B and 21C, the top of the first isolation layer 441 is below the level of the first top surface 481 of the semiconductor fin 410 at the active device region(s) 411, but is at the same level as the first top surface 481 of the semiconductor fin 410 at the trench isolation region(s) 415.

The semiconductor structure 400 can further include an isolation bump 425 on the second top surface 483 of each trench isolation region 415. Each isolation bump 425 and the trench isolation region 415 below can be approximately vertically aligned and can have approximately equal widths as measured in a direction along the length of the semiconductor fin 410, as illustrated in FIG. 21A. Alternatively, the width of the isolation bump 425 can be slightly greater or slightly less than that of the trench isolation region 415 below. Each isolation bump 425 can further extend laterally beyond the trench isolation region 415 and the first opposing sidewalls of the semiconductor fin 410 so as to be above and immediately adjacent to the first isolation layer 441. The isolation bump 425 can be made of an additional isolation layer 443. The additional isolation layer 443 can be, for example, a layer of silicon dioxide such that the isolation bump(s) are silicon dioxide bump(s). Alternatively, the additional isolation layer 443 can include one or more layers of any suitable isolation material (e.g., silicon dioxide, silicon oxycarbide, etc). See detailed discussion of the method above regarding selection of the isolation materials for the first isolation layer 441, the optional second isolation layer 442 and the additional isolation layer 443. In any case, each isolation bump 425 can have a third top surface 485 and third opposing sidewalls 486.

The semiconductor structure 400 can further include sidewall spacers 426 on the third opposing sidewalls 486 of each isolation bump 425. The material of the sidewall spacers 426 can be a dielectric material that is different from the isolation material used for at least the first isolation layer 441 and the additional isolation layer 443. For example, the sidewall spacers 426 can be silicon nitride sidewall spacers. Furthermore, a combination of the width 496 of a given isolation bump 425 and the width 495 of each sidewall spacer 426 thereon should be such that at least outer portions of the sidewall spacers 426 are above and immediately adjacent to the first top surface 481 of the semiconductor fin 410 (i.e., such that at least outer portions of the sidewall spacers 426 extend laterally some predetermined distance beyond the second opposing sidewalls 484 of the trench isolation region 415 below).

The semiconductor structure 400 can further include at least one transistor 401 and, particularly, at least one FINFET. Each FINFET 401 can include source/drain regions 413; a channel region 412 positioned laterally between the source/drain regions 413; and a gate structure adjacent to the first top surface 481 and first opposing sidewalls 482 of the semiconductor fin 410 at the channel region 412.

Specifically, the channel region 412 can be within a corresponding active device region 411 in the semiconductor fin 410. The active device region 411 or at least the channel region 412 therein can have appropriate type conductivity at a relatively low conductivity level. For example, for a P-type FINFET, the channel region 412 can be doped so as to have an N− conductivity; whereas, for an N-type FINFET, the channel region 412 can be doped so as to have a P− conductivity. Alternatively, the channel region 412 can be undoped.

The gate structure can be a replacement metal gate (RMG) structure 470, as illustrated. Alternatively, the gate structure can be a gate-first gate structure. Gate sidewall spacers 464 (e.g., silicon nitride gate sidewall spacers) can be positioned laterally adjacent to each gate structure. It should be noted that, given the method used to form the semiconductor structure 400 as described in detail above, the semiconductor structure 400 will also include a non-functioning gate structure (e.g., a non-functioning RMG 470') with gate sidewall spacers 464 above each of isolation bump 425.

The source/drain regions 413 can be on opposite sides of the gate structure 470. Each source/drain region 413 can include a source/drain recess having a first side 488, a second side 489 opposite the first side 488 and a bottom 487. The first side 488 can be positioned laterally adjacent to the channel region 412. The second side 489 can be positioned laterally adjacent to, but physically separated from, a trench isolation region 415. The bottom 487 can be at a second depth 494, which is above the first depth 498 of the trench(es) used for the trench isolation region(s) 415. Each source/drain region 413 can further include a semiconductor layer within the source/drain recess and can have a fourth top surface 490.

The semiconductor layer can be an epitaxial semiconductor layer that is in-situ doped so as to have the appropriate type conductivity at a relatively high conductivity level. For example, for a P-type FINFET, the additional semiconductor layer can be in-situ doped with a P-type dopant so as to have P+ conductivity; whereas, for an N-type FINFET, the additional semiconductor layer can be in-situ doped with an N-type dopant so as to have N+ conductivity. Additionally, the semiconductor layer can be made of the same first semiconductor material as that used for the semiconductor fin 410 (e.g., silicon). Alternatively, the semiconductor layer can be made of a second semiconductor material that is different from the first semiconductor material. The type of second semiconductor material used may be preselected to enhance FINFET performance and may vary depending upon whether the FINFET being formed is a P-type FINFET or an N-type FINFET. For example, for a P-type FINFET, the additional semiconductor layer can be a silicon germanium (SiGe) layer, which will enhance majority charge carrier mobility within the P-type FINFET's channel region and, thereby enhance performance. For an N-type FINFET, the additional semiconductor layer can be a silicon carbide (SiC) layer, which will enhance majority charge carrier mobility within the N-type FINFET's channel region and, thereby enhance performance.

As mentioned above, during processing, the sidewall spacers 426 on the isolation bump(s) 425 protect the area of the semiconductor fin 410 immediately adjacent the trench isolation region(s) 415 to ensure that semiconductor surfaces are exposed on the opposing sides and bottoms of the source/drain recesses. Since the opposing sides and bottoms of the source/drain recesses include semiconductor surfaces onto which the semiconductor layer is epitaxially deposited to form the source/drain regions 413, the angle of the fourth top surface 490 of each source/drain region 413 relative to the first top surface 481 of the semiconductor fin 410 will be minimized. Thus, for example, the fourth top surface 490 of each source/drain region 413 can be approximately parallel to and level with or higher than the first top surface 481 of the semiconductor fin 410.

The semiconductor structure 400 can further include a blanket interlayer dielectric (ILD) layer 444 on the fourth top surface 490 of each of the source/drain regions 413 and laterally surrounding the gate structures 470/470'. The ILD layer 444 can be, for example, a silicon oxide layer or one or more layers of any suitable ILD material(s) (e.g., silicon dioxide, silicon nitride, borophosphosilicate glass (BPSG), tetraethyl orthosilicate (TEOS), fluorinated tetraethyl orthosilicate (FTEOS), etc.).

The semiconductor structure 400 can further include source/drain contacts 418 (also referred to in the art as metal plugs). Specifically, the semiconductor structure 400 can include contact openings that extend essentially vertically through the ILD layer 444 to the fourth top surfaces 490 of the source/drain regions 413. Source/drain contacts 418 within the contact openings can include one or more conformal layers such as a conformal adhesive layer (e.g., a titanium adhesive layer or other suitable adhesive layer) and/or a conformal barrier layer (e.g., titanium nitride barrier layer or other suitable barrier layer), which line the contact openings. The source/drain contacts 418 can further include a conductor and, particularly, a metal or metal alloy (e.g., a tungsten, cobalt, aluminum or any other suitable metal plug material), which fills the remaining space within the contact openings. Since, as discussed above, the method of forming the semiconductor structure ensures that the angle of the fourth top surface 490 of each source/drain region 413 relative to the first top surface 481 of the semiconductor fin 410 is reduced, the risk of any unlanded contacts is also reduced. That is, the risk that a defect and, particularly, a void will be present between any given source/drain contact 418 and the source/drain region 413 below is reduced.

In the embodiments of the method and semiconductor structure described above, the FINFET(s) 401 can be N-type FINFET(s) or P-type FINFET(s). As discussed, for an N-type FINFET, the channel region can have P-type conductivity (or can be undoped) and the source/drain regions can have N-type conductivity; whereas, for a P-type FINFET, the channel region can have N-type conductivity (or can be undoped) and the source/drain regions can have P-type conductivity. Those skilled in the art will recognize that different dopants can be used to achieve the different conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels will depend upon the relative concentration levels of the dopants.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming an isolation region in a semiconductor fin, the semiconductor fin having a first top surface and first opposing sidewalls and the isolation region having a second top surface and second opposing sidewalls;
   forming a hard mask layer over the first top surface and the second top surface;
   forming a bump opening in the hard mask layer aligned above the isolation region;
   forming an isolation bump in the bump opening on the isolation region, the isolation bump having a third top surface and third opposing sidewalls;
   forming a pair of sidewall spacers on the third opposing sidewalls; and,
   performing an etch process to expose the first opposing sidewalls of the semiconductor fin and to recess the third top surface of the isolation bump, wherein the sidewall spacers prevent lateral etching of the isolation bump during the etch process.

2. The method of claim 1, the forming of the sidewall spacers comprising using a dry etch process to remove portions of the hard mask layer from horizontal surfaces.

3. The method of claim 1, the forming of the sidewall spacers comprising:
   removing the hard mask layer;
   depositing a conformal dielectric spacer layer; and
   performing an anisotropic etch process to form the sidewall spacers.

4. The method of claim 1, wherein the bump opening containing the isolation bump and a trench containing the isolation region have approximately equal widths.

5. The method of claim 1, wherein the isolation bump and the sidewall spacers comprise different materials.

6. The method of claim 1, further comprising:
   etching a recess in the semiconductor fin, the sidewall spacers protecting an area of the semiconductor fin adjacent to the second opposing sidewalls of the isolation region during the etching such that the recess is physically separated from the isolation region and such that, within the recess, semiconductor surfaces are exposed at opposing sides of the recess and at a bottom of the recess; and
   epitaxially depositing a semiconductor layer on the semiconductor surfaces.

7. The method of claim 6, wherein the semiconductor fin and the semiconductor layer comprise a different semiconductor materials.

8. The method of claim 1, further comprising forming gate structures on the isolation bump and on an active device region of the semiconductor fin above a channel region; and forming additional sidewall spacers on the gate structures, wherein, during the forming of the additional sidewall spacers, a height of the sidewall spacers is reduced.

9. A method comprising:
   forming isolation regions in a semiconductor fin, the semiconductor fin having a first top surface and first opposing sidewalls and each isolation region having a second top surface and second opposing sidewalls;
   forming a hard mask layer on the first top surface of the semiconductor fin and the second top surface of each isolation region;
   forming bump openings in the hard mask layer aligned above the isolation regions, respectively;
   forming isolation bumps in the bump openings on the isolation regions, each isolation bump having a third top surface and third opposing sidewalls;
   forming a pair of sidewall spacers on the third opposing sidewalls, the forming of the sidewall spacers comprising using a dry etch process to remove portions of the hard mask layer from horizontal surfaces; and
   performing an etch process to expose the first opposing sidewalls of the semiconductor fin and to recess the third top surface of each isolation bump, wherein the sidewall spacers prevent lateral etching of the third opposing sidewalls of the isolation bumps during the etch process.

10. The method of claim 9, wherein the bump openings containing the isolation bumps and trenches containing the isolation regions have approximately equal widths.

11. The method of claim 9, further comprising forming source/drain regions in each active device region such that a channel region is positioned laterally between the source/drain regions, the forming of the source/drain regions comprising:
    etching source/drain recesses in each active device region, the sidewall spacers protecting areas of the semiconductor fin adjacent to the second opposing sidewalls of each isolation region during the etching such that the source/drain recesses are physically separated from the isolation regions and such that, within each source/drain recess, semiconductor surfaces are exposed at a first side of the source/drain recess adjacent to the channel region, at a second side of the source/drain recess opposite the first side and at a bottom of the source/drain recess; and
    epitaxially depositing a semiconductor layer on the semiconductor surfaces.

12. The method of claim 11, wherein the semiconductor fin and the semiconductor layer comprise different semiconductor materials.

13. The method of claim 9, further comprising forming gate structures on the isolation bumps and on each active device region above a channel region; and forming additional sidewall spacers on the gate structures, wherein, during the forming of the additional sidewall spacers, a height of the sidewall spacers is reduced.

14. The method of claim 13, wherein the isolation bumps comprise silicon oxide bumps and wherein the sidewall spacers and the additional sidewall spacers comprise silicon nitride sidewall spacers.

* * * * *